US010256250B2

United States Patent
Kim et al.

(10) Patent No.: US 10,256,250 B2
(45) Date of Patent: Apr. 9, 2019

(54) THREE DIMENSIONAL SEMICONDUCTOR MEMORY DEVICE

(71) Applicant: SAMSUNG ELECTRONICS CO., LTD., Suwon-si, Gyeonggi-Do (KR)

(72) Inventors: Kihyun Kim, Seoul (KR); Chadong Yeo, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/708,266

(22) Filed: Sep. 19, 2017

(65) Prior Publication Data

US 2018/0006055 A1 Jan. 4, 2018

Related U.S. Application Data

(62) Division of application No. 14/711,811, filed on May 14, 2015.

(30) Foreign Application Priority Data

Jul. 2, 2014 (KR) ........................ 10-2014-0082550

(51) Int. Cl.
| | | |
|---|---|---|
| H01L 27/11582 | (2017.01) | |
| H01L 27/11524 | (2017.01) | |
| H01L 27/11556 | (2017.01) | |
| H01L 27/1157 | (2017.01) | |
| H01L 27/11548 | (2017.01) | |
| H01L 27/11575 | (2017.01) | |
| H01L 27/11578 | (2017.01) | |

(52) U.S. Cl.
CPC .... H01L 27/11582 (2013.01); H01L 27/1157 (2013.01); H01L 27/11524 (2013.01); H01L 27/11548 (2013.01); H01L 27/11556 (2013.01); H01L 27/11575 (2013.01); *H01L 27/11578* (2013.01)

(58) Field of Classification Search
CPC ......... H01L 27/11582; H01L 27/11524; H01L 27/11556; H01L 27/1157; H01L 27/11575; H01L 27/11578
USPC ......... 257/314, 329, 324, E27.103, E27.098, 257/E27.084
See application file for complete search history.

(56) References Cited

U.S. PATENT DOCUMENTS

| | | |
|---|---|---|
| 2012/0077320 A1 | 3/2012 | Shim et al. |
| 2012/0280304 A1 | 11/2012 | Lee et al. |
| 2013/0092994 A1 | 4/2013 | Shim et al. |
| 2013/0100742 A1 | 4/2013 | Lee et al. |

(Continued)

*Primary Examiner* — Robert T Huber
(74) *Attorney, Agent, or Firm* — F. Chau & Associates, LLC

(57) ABSTRACT

A three-dimensional semiconductor memory device is provided. A stacked structure is formed on a substrate. The stacked structure includes conductive patterns vertically stacked on the substrate. A selection structure including selection conductive patterns is stacked on the stacked structure. A channel structure penetrates the selection structure and the stacked structure to connect to the substrate. An upper interconnection line crosses the selection structure. A conductive pad is disposed on the channel structure to electrically connect the upper interconnection line to the channel structure. A bottom surface of the conductive pad is positioned below a top surface of the uppermost selection conductive pattern of the selection conductive patterns.

15 Claims, 23 Drawing Sheets

(56) References Cited

U.S. PATENT DOCUMENTS

| | | |
|---|---|---|
| 2013/0234231 A1 | 9/2013 | Fujiki et al. |
| 2014/0273373 A1* | 9/2014 | Makala ............. H01L 27/11582 |
| | | 438/270 |
| 2016/0005759 A1 | 1/2016 | Kim et al. |

* cited by examiner

THREE DIMENSIONAL SEMICONDUCTOR MEMORY DEVICE

CROSS-REFERENCE TO RELATED APPLICATION

This application is a Divisional of application Ser. No. 14/711,811, filed May 14, 2015, which claims priority under 35 U.S.C. § 119 to Korean Patent Application No. 10-2014-0082550, filed on Jul. 2, 2014 in the Korean Intellectual Property Office, the disclosures of which are incorporated by reference herein in their entirety.

TECHNICAL FIELD

The present inventive concept relates to a three-dimensional semiconductor memory device.

DISCUSSION OF RELATED ART

Higher integration of semiconductor devices is required to satisfy consumer demands for superior performance and inexpensive prices. In the case of semiconductor devices, since their integration is an important factor in determining product prices, increased integration is especially required. In the case of typical two-dimensional or planar semiconductor memory devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices.

To overcome such a limitation, there have been recently proposed three-dimensional semiconductor memory devices having three-dimensionally arranged memory cells. However, for mass-production of three-dimensional semiconductor memory devices, a new process technology should be developed in such a manner that it can provide a lower manufacturing cost per bit than two-dimensional memory devices while maintaining or exceeding their level of reliability.

SUMMARY

According to an exemplary embodiment of the present inventive concept, a three-dimensional semiconductor memory device is provided. A stacked structure is formed on a substrate. The stacked structure includes conductive patterns vertically stacked on the substrate. A selection structure including selection conductive patterns is stacked on the stacked structure. A channel structure penetrates the selection structure and the stacked structure to connect to the substrate. An upper interconnection line crosses the selection structure. A conductive pad is disposed on the channel structure to electrically connect the upper interconnection line to the channel structure. A bottom surface of the conductive pad is positioned below a top surface of the uppermost selection conductive pattern of the selection conductive patterns.

According to an exemplary embodiment of the present inventive concept, a three-dimensional semiconductor memory device is provided. A stacked structure is formed on a substrate. A first selection structure extending along a first direction and including a plurality of first selection conductive patterns is vertically stacked on a substrate. A second selection structure adjacent to the first selection structure and including a plurality of second selection conductive patterns is vertically stacked on the substrate. First and second channel structures penetrate the first and second selection structures, respectively. An upper interconnection line crosses the first and second selection structures. First and second conductive pads are formed on the first and second channel structures, respectively, to electrically connect the upper interconnection line to the first and second channel structures. Bottom surfaces of the first and second conductive pads are positioned below top surfaces of the uppermost first and second selection conductive patterns.

According to an exemplary embodiment of the present inventive concept, a three-dimensional semiconductor memory device is provided. A vertical channel is formed on a substrate. A conductive pad is formed on the vertical channel. The conductive pad includes impurities of a first conductivity type. A bit line is formed on the conductive pad. The bit line is electrically coupled to the conductive pad. A plurality of word lines is vertically stacked on the substrate. The plurality of word lines is adjacent to the vertical channel. A plurality of selection conductive patterns is vertically formed on the plurality of word lines. The vertical channel includes a channel impurity region and an offset region. The offset region is interposed between the conductive pad and the channel impurity region. The channel impurity region has impurities of a second conductivity type.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
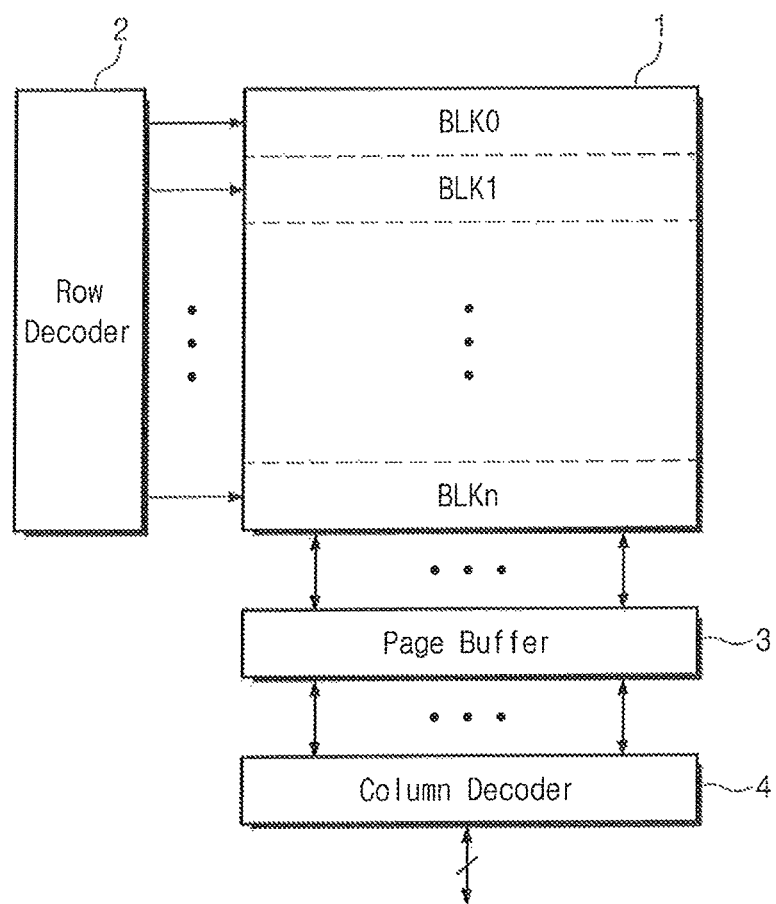
FIG. 1 is a schematic block diagram illustrating a three-dimensional semiconductor memory device according to an exemplary embodiment of the inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a schematic block diagram illustrating a three-dimensional semiconductor memory device according to an exemplary embodiment of the inventive concept.

Referring to FIG. 1, a three-dimensional semiconductor memory device includes a memory cell array 1, a row decoder 2, a page buffer 3, and a column decoder 4.

The memory cell array 1 includes a plurality of memory blocks BLK0-BLKn, each of which is configured to independently perform an erase operation. Each of the memory blocks BLK0-BLKn includes a plurality of memory cells, and a plurality of word and bit lines electrically connected to the memory cells. The memory cell array 1 will be described in more detail with reference to FIG. 2.

The row decoder 2 decodes address information transmitted from the outside to select one of the word lines based on the decoded address information. The row decoder 2 is connected in common to the plurality of memory blocks BLK0-BLKn and provides a driving signal to the word lines of one of the memory blocks BLK0-BLKn which is selected on the basis of a block selection signal. The block selection signal may be a part of the address information. The row decoder 2 may also provide word line voltages to a selected word line and unselected word lines, in response to control signals from a control circuit (not shown). The word line voltages may be generated in a voltage generator (not shown).

Depending on an operation mode, the page buffer 3 temporarily stores data to be stored in the memory cells or data read from the memory cells. For example, the page buffer 3 may function as a write driver in a program operation mode or as a sense amplifier in a read operation mode. The page buffer 3 may provide an electric signal (e.g., voltage or current) transmitted from the control circuit to at least one of the bit lines.

First bit lines may be used to read data from the memory cell array 1 to the page buffer 3, and second bit lines may be used to write from the page buffer 3 to the memory cell array 1.

The column decoder 4 decodes the address information transmitted from the outside and selects one of the bit lines based on the decoded address information. The column decoder 4 is connected in common to the plurality of memory blocks BLK0-BLKn and provides data to the bit lines of one of the memory blocks BLK0-BLKn which is selected on the basis of a block selection signal. The block selection signal may be a part of the address information. The column decoder 4 provides a data transmission path between the page buffer 3 and an external device (e.g., a memory controller).

Figure 2:
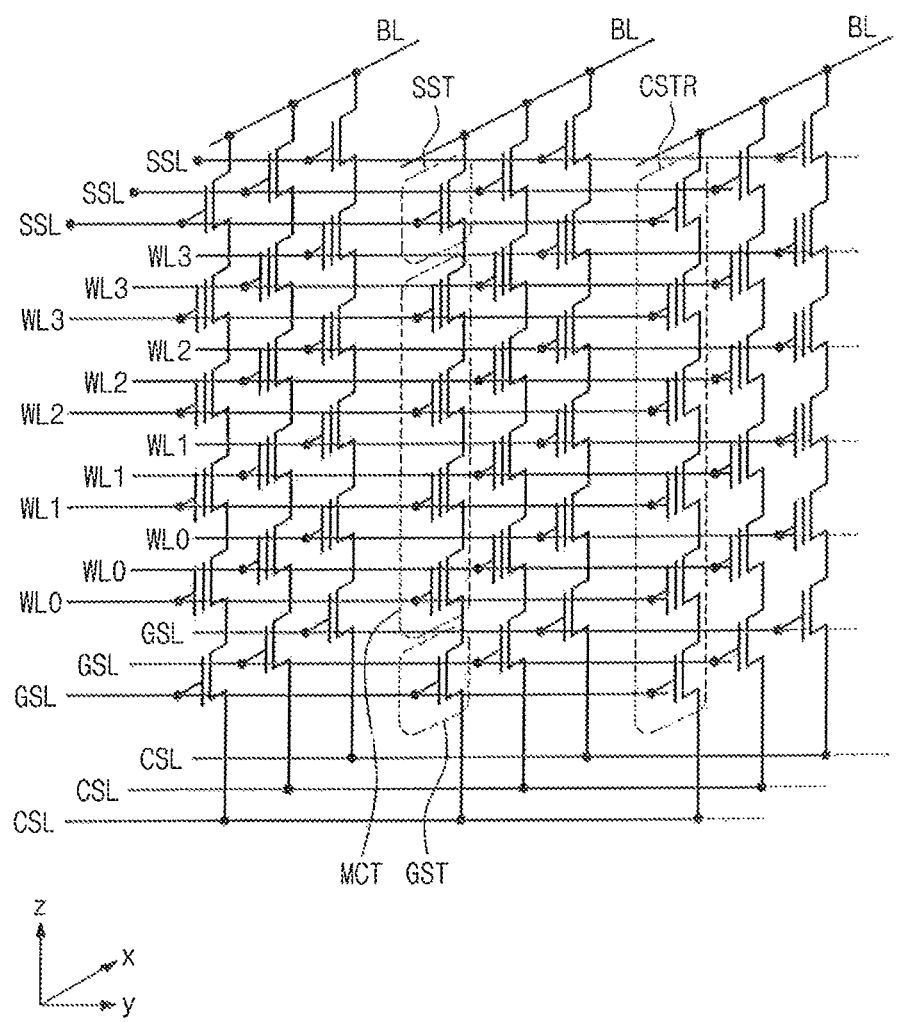
FIG. 2 is a schematic circuit diagram illustrating a three-dimensional semiconductor memory device according to an exemplary embodiment of the inventive concept.

FIG. 2 is a schematic circuit diagram illustrating a three-dimensional semiconductor memory device according to an exemplary embodiment of the inventive concept.

Referring to FIG. 2, a three-dimensional semiconductor memory device includes a cell array region. The cell array region includes common source lines CSL, bit lines BL, and cell strings CSTR interposed between the common source lines CSL and the bit lines BL.

The bit lines BL are two-dimensionally arranged. The cell strings CSTR are connected between the bit lines BL and the common source lines CSL. For example, each cell string CSTR is interposed between a bit line BL and a common source line CSL. The common source lines CSL are two-dimensionally arranged. In an exemplary embodiment, the common source lines CSL may be connected with each another so that the common source lines CSL are in an equipotential state. Alternatively, the common source lines CSL may be separated from each another to be independently controlled.

Each of the cell strings CSTR includes a ground selection transistor GST coupled to a common source line CSL, a string selection transistor SST coupled to a bit line BL, and memory cell transistors MCT disposed between the ground and string selection transistors GST and SST. The ground selection transistor GST, the memory cell transistors MCT, and the string selection transistor SST are connected in series.

A source region of the ground selection transistors GST is connected to the common source line CSL. For the convenience of description, one ground selection line GSL, three word lines WL0 to WL3, and a string selection line SSL are disposed in each cell string CSTR between the common source line CSL and the bit line BL to serve as gate electrodes of the ground selection transistor GST, the memory cell transistors MCT, and the string selection transistor SST, respectively. Each of the memory cell transistors MCT may include a data storage element or a data storing layer.

Figure 3:
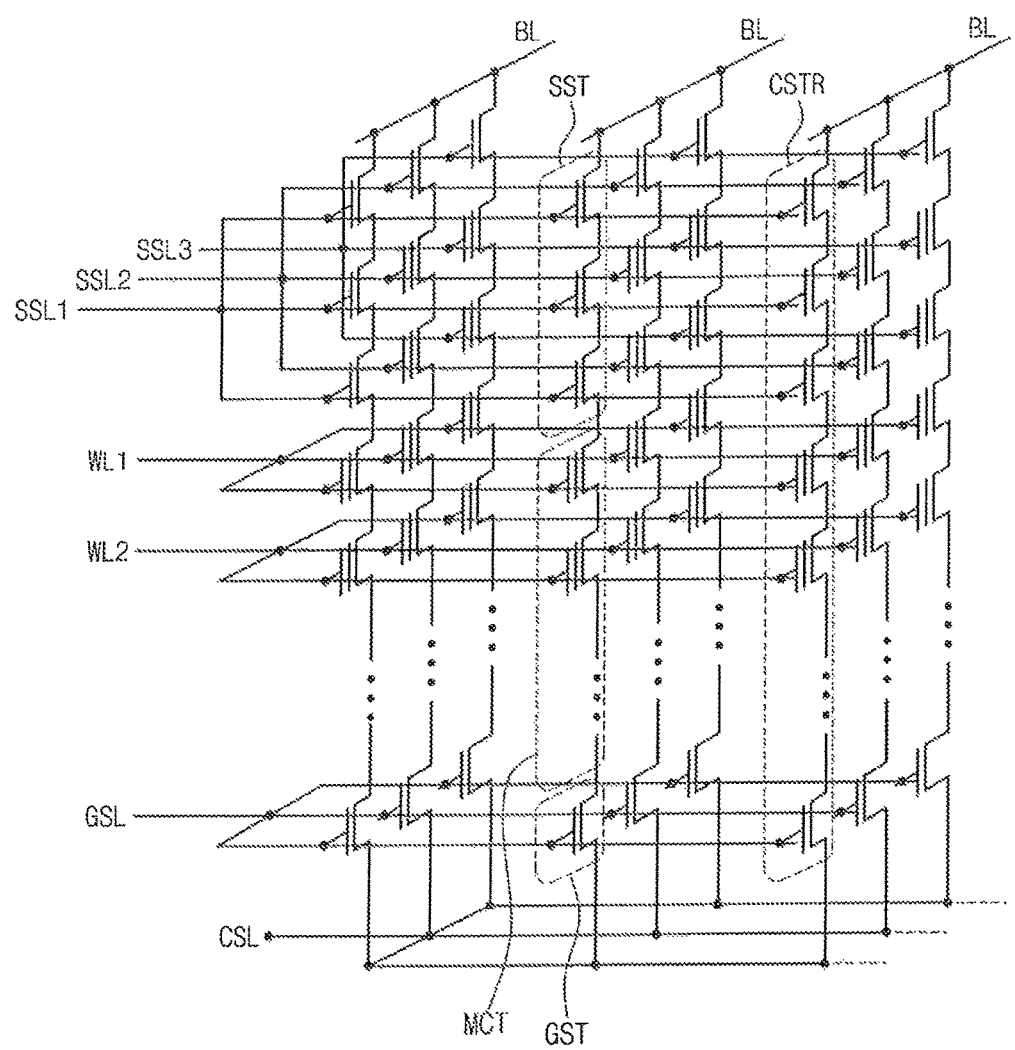
FIG. 3 is a circuit diagram illustrating a portion of a cell array of a three-dimensional semiconductor memory device according to an exemplary embodiment of the inventive concept.

FIG. 3 is a circuit diagram illustrating a portion of a cell array of a three-dimensional semiconductor memory device according to an exemplary embodiment of the inventive concept.

Referring to FIG. 3, a cell array of a three-dimensional semiconductor memory device includes a common source line CSL, bit lines BL, and cell strings CSTR between the common source line CSL and the bit lines BL.

Each of the cell strings CSTR includes a ground selection transistor GST connected to the common source line CSL, a string selection transistor SST connected to the bit line BL, and memory cell transistors MCT provided between the ground and string selection transistors GST and SST.

The string selection transistor SST includes three MOS transistors connected in series to the bit line BL, for example. Gate electrodes of the three MOS transistors are connected to string selection lines SSL1, SSL2, and SSL3, respectively. Three cell strings CSTR are connected in common to each of the bit lines BL, for example. The string selection transistors SST connected in common of each bit line BL are respectively controlled by the string selection lines SSL1, SSL2, and SSL3 which are electrically separated from each other.

Each of the cell strings CSTR includes a ground selection transistor GST. The ground selection transistor GST may include at least one MOS transistors. Gate electrodes of the ground selection transistors GST of the cell strings CSTR shares the ground selection line GSL. For example, the gate electrodes of the ground selection transistors GST are electrically connected to each other.

Figure 4:
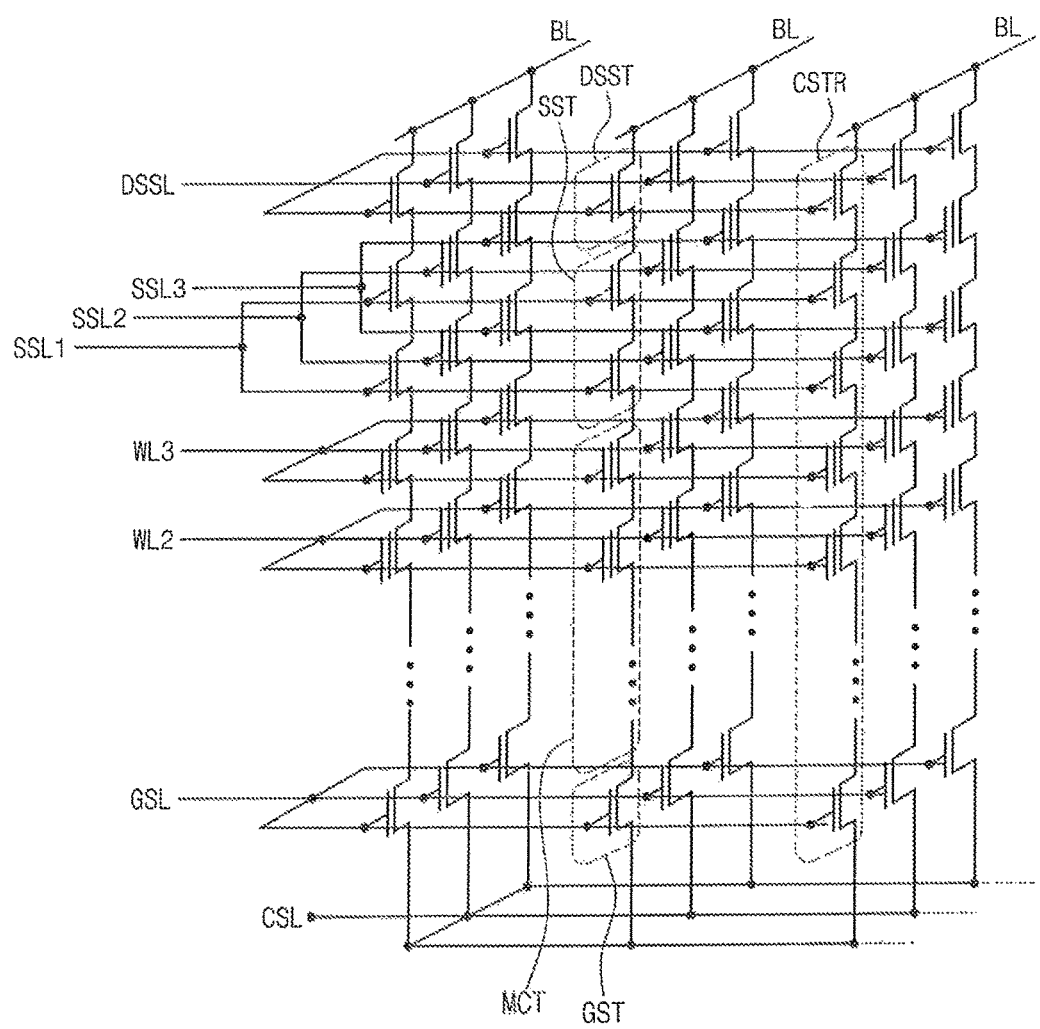
FIG. 4 is a circuit diagram illustrating a portion of a cell array of a three-dimensional semiconductor memory device according to an exemplary embodiment of the inventive concept.

FIG. 4 is a circuit diagram illustrating a portion of a cell array of a three-dimensional semiconductor memory device according to an exemplary embodiment of the inventive concept.

Referring to FIG. 4, a cell array of a three-dimensional semiconductor memory device may include a common source line CSL, bit lines BL, and cell strings CSTR disposed between the common source line CSL and the bit lines BL.

Each of the cell strings CSTR includes a ground selection transistor GST connected to the common source line CSL, a dummy selection transistor DST connected to the bit line BL, a string selection transistor SST connected in series to the dummy selection transistor DST, and memory cell transistors MCT provided between the ground and string selection transistors GST and SST.

The string selection transistor SST includes two MOS transistors connected in series to the dummy selection transistor DST, for example. Three cell strings CSTR are connected to a bit line BL, for example. The string selection transistors SST of the three cell strings CSTR include gate electrodes which are connected to their respective string selection lines SSL1, SSL2, and SSL3. The string selection transistors SST connected in common of each bit line BL may be respectively controlled by the string selection lines SSL1, SSL2, and SSL3. The string selection lines SSL1, SSL2 and SSL3 are electrically separated from each other. Gate electrodes of the dummy selection transistors DST share a single dummy string selection line DSSL. For example, the gate electrodes of the dummy selection transistors DST are electrically connected to each other.

Each of the cell strings CSTR includes a ground selection transistor GST. The ground selection transistor GST may include at least one MOS transistors. Gate electrodes of the ground selection transistors GST of the cell strings CSTR shares the ground selection line GSL. For example, the gate electrodes of the ground selection transistor GST are electrically connected to each other.

Figure 5:
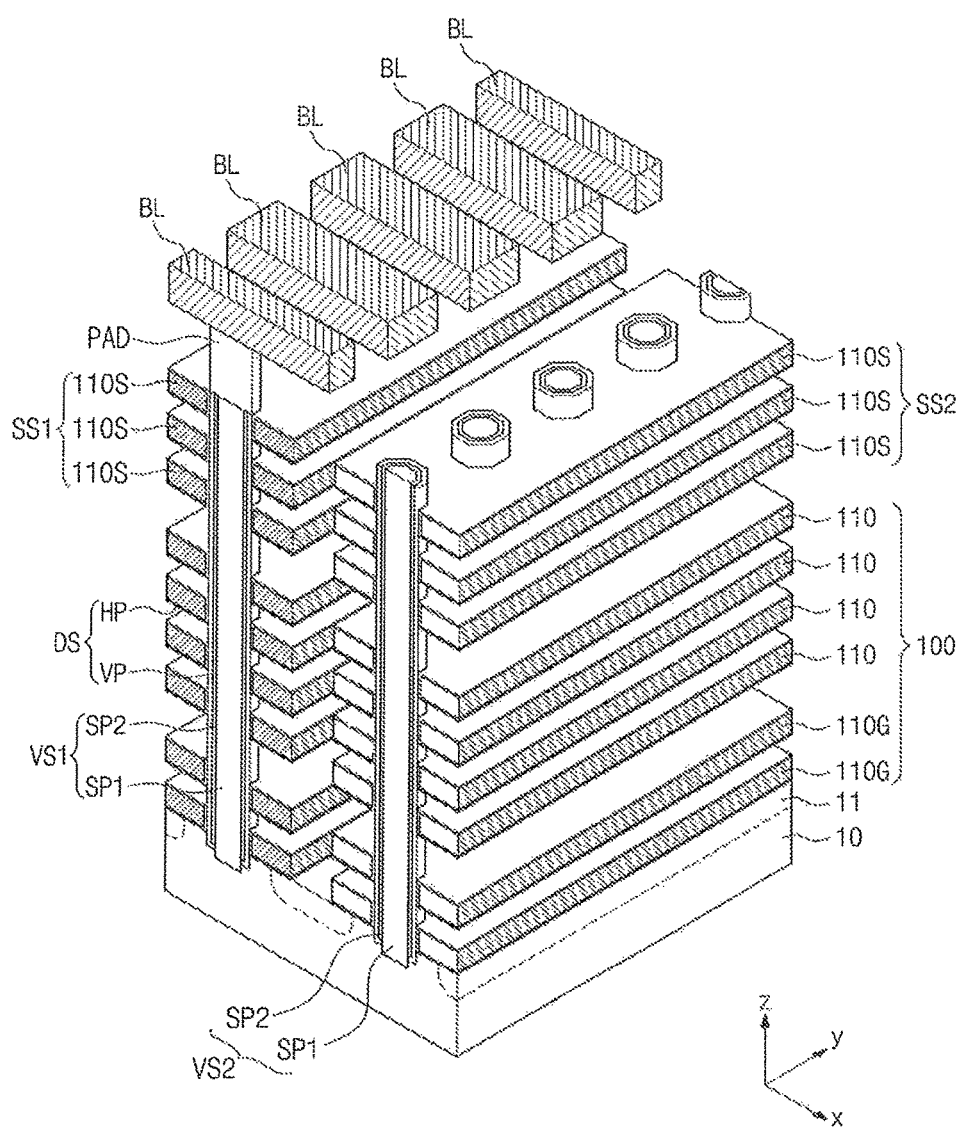
FIG. 5 is a perspective view illustrating a three-dimensional semiconductor memory device, according to an exemplary embodiment of the inventive concept.
Figure 6:
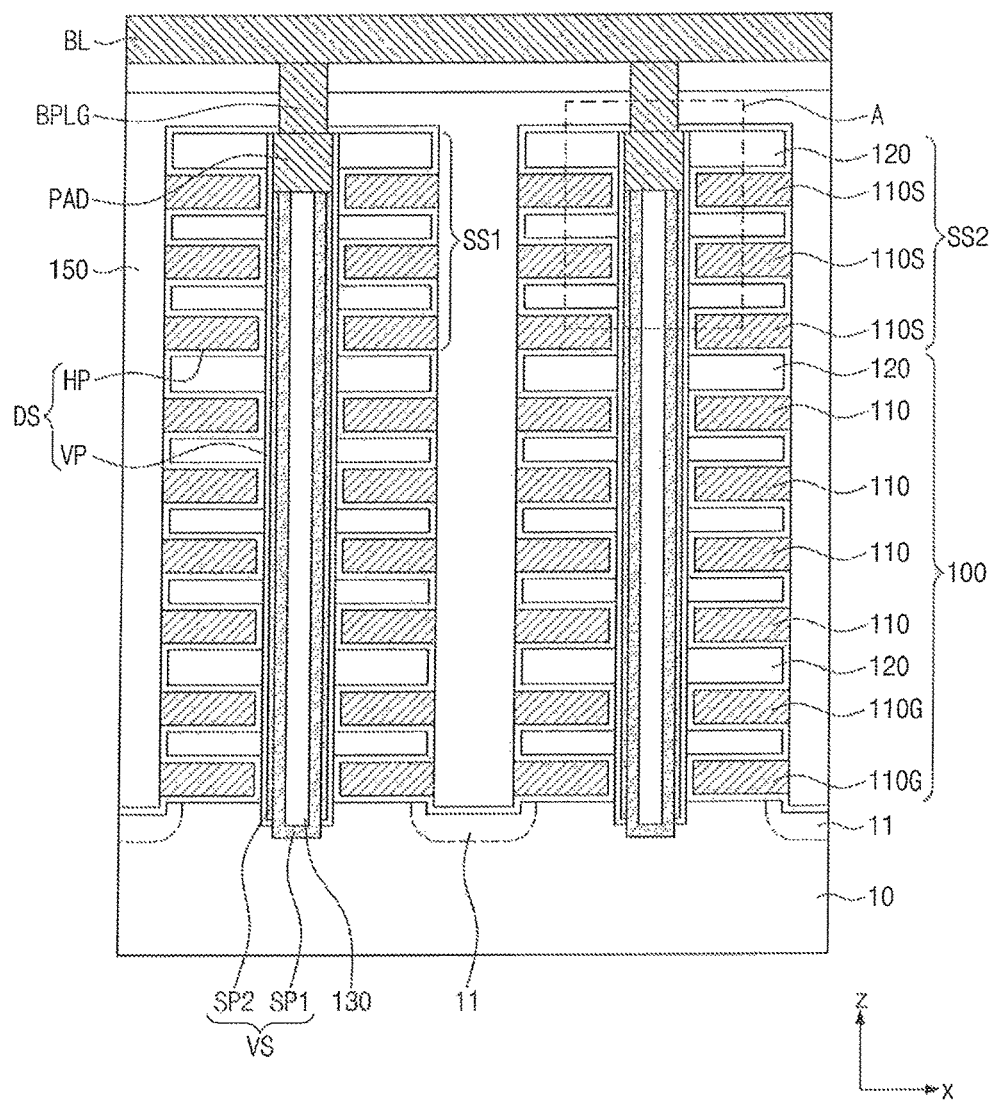
FIGS. 6 and 7 are sectional views taken along a direction of a bit line of a three-dimensional semiconductor memory device, according to an exemplary embodiment of the inventive concept.

FIG. 5 is a perspective view illustrating a cell array of a three-dimensional semiconductor memory device, according to an exemplary embodiment of the inventive concept. FIG. 6 is a sectional view taken along a direction of a bit line in the three-dimensional semiconductor memory device of FIG. 5, according to an exemplary embodiment of the inventive concept.

Referring to FIGS. 5 and 6, two stacked structures 100 are formed on a substrate 10, and first and second selection structures SS1 and SS2 which are formed on the stacked structures 100. Each of the stacked structures 100 includes two lower conductive patterns 110G vertically stacked on the substrate 10 and four cell conductive patterns 110 vertically stacked on the lower conductive patterns 110G. Each of the first and second selection structures SS1 and SS2 includes three selection conductive patterns 110S vertically stacked on the substrate 10. The present invention is not limited thereto, and the patterns 110, 110G and 110S may have various number of patterns.

The substrate 10 may be formed of a semiconductor material, such as silicon, germanium, or silicon-germanium. The substrate 10 includes a common source region 11 doped with impurities. A lower insulating layer may be formed between the substrate 10 and the stacked structure 100. For example, the lower insulating layer may be a silicon oxide layer which may be formed by a thermal oxidation process. Alternatively, the lower insulating layer may be a silicon oxide layer which may be formed by a thin-film deposition process. The lower insulating layer may be thinner than insulating layers provided thereon.

The lower conductive patterns 110G are arranged in an x-axis direction. The lower conductive patterns 110G which are positioned at substantially the same level from the substrate 10 may be connected to each other to be in the equipotential state. Alternatively, each of the lower and cell conductive patterns 110G and 110 may be provided to have a plate-shaped structure.

For example, each of the stacked structures 100 includes insulating layers 120 each of which is interposed between a vertically-separated pair of the lower and cell conductive patterns 110G and 110. Each of the lower and cell conductive patterns 110G and 110 may include at least one of conductive materials such as a doped semiconductor (e.g., doped silicon and so forth), metals (e.g., tungsten, copper, aluminum, and so forth), conductive metal nitrides (e.g., titanium nitride, tantalum nitride, and so forth), or transition metals (e.g., titanium, tantalum, and so forth). The insulating layers 120 may have substantially the same thickness. The inventive concept is not limited thereto, and the insulating layers 120 may have different thickness. For example, the lowermost insulating layer 120 may be thinner than the others. Alternatively, at least one of the insulating layers 120 may be thicker than the others. The insulating layers 120 may include a silicon oxide layer.

The first and second selection structures SS1 and SS2 are arranged side by side in the x-axis direction, for example. Each of the first and second selection structures SS1 and SS2 includes selection conductive patterns 110S vertically stacked on the stacked structure 100. Here, the selection conductive patterns 110S of the first selection structure SS1 serves as the first string selection line SSL1 of FIGS. 3 and 4. The selection conductive patterns 110S of the second selection structure SS2 serves as the second string selection line SSL2 of FIG. 3 and FIG. 4. For example, the selection conductive patterns 110S extends parallel to a y-axis direction crossing the x-axis direction, and the selection conductive patterns 110S positioned at the same level from the substrate 10 may be horizontally and electrically separated from each other. Further, the selection conductive patterns 110S positioned at different levels from the substrate 10 may be connected to each other. The selection conductive patterns 110S are stacked on the stacked structure 100 with the insulating layers 120 interposed therebetween. In an exemplary embodiment, the selection conductive patterns 110S may be provided to have substantially the same thickness as that of the cell conductive patterns 110, and a vertical space between the selection conductive patterns 110S may be substantially equal to or smaller than the thickness of the cell conductive patterns 110.

In an exemplary embodiment, a first channel structure VS1 penetrates the first selection structure SS1 and the stacked structure 100, and a second channel structure VS2 penetrates the second selection structure SS2 and the stacked structure 100. The first and second channel structures VS1 and VS2 are arranged in the x-axis direction, when viewed in plan view. Alternatively, the first and second channel structures VS1 and VS2 may be arranged in a zigzag shape, when viewed in plan view.

In an exemplary embodiment, each of the first and second channel structures VS1 and VS2 includes a first semiconductor pattern SP1 connected to the substrate 10 and a second semiconductor pattern SP2 interposed between the first semiconductor pattern SP1 and a data storing layer DS. The first and second semiconductor patterns SP1 and SP2 may be formed of a semiconductor material. The first semiconductor pattern SP1 is shaped like a hollow pipe with a closed bottom surface. The inner space of the first semiconductor pattern SP1 is filled with an insulating gap-fill pattern 130. Alternatively, the first semiconductor pattern SP1 may be shaped like a hollow pipe or macaroni. The first and second semiconductor patterns SP1 and SP2 may be in the undoped state or may be doped to have the same conductivity type as the substrate 10. The first and second semiconductor patterns SP1 and SP2 may have a polycrystalline or single crystalline structure.

Conductive pads PAD are formed on the first and second channel structures VS1 and VS2, respectively. Each of the conductive pads PAD electrically connects one of the first and second channel structures VS1 and VS2 to a corresponding one of the bit lines BL. The conductive pad PAD may have a different conductivity type (e.g., n-type) from the substrate 10. Alternatively, the conductive pad PAD may be formed of a conductive material. In an exemplary embodiment, the conductive pad PAD has a bottom surface located below a top surface of the uppermost selection conductive pattern 110S. This will be described in more detail with reference to FIGS. 8 through 11.

The bit lines BL cross over the first and second selection structures SS1 and SS2 and are separated from each other. The bit lines BL are electrically connected to the first and second channel structures VS1 and VS2 via the conductive pad PAD. The common source impurity regions 11 are formed in the substrate 10 between the stacked structures 100 to have a different conductivity type from that of the substrate 10.

The data storing layer DS are provided between the cell conductive patterns 110 and the first and second channel structures VS1 and VS2. In an exemplary embodiment, the data storing layer DS may include a charge storing layer. For example, the data storing layer DS may include a trap insulating layer, a floating gate electrode, and/or an insulating layer with conductive nano dots. Data stored in the data storing layer DS may be changed using a Fowler-Nordheim (FN) tunneling effect, which may be caused by a difference in voltage between the first and second channel structures VS1 and VS2 and the cell conductive patterns 110. In exemplary embodiments, the data storing layer DS may include a layer (for example, exhibiting a phase-changeable or variable resistance property) which is capable of storing data therein based on other physical effect. The data storing layer DS includes a vertical insulating layer VP and a horizontal insulating layer HP. The vertical insulating layer VP penetrates the lower and cell conductive patterns 110G and 110. The horizontal insulating layer HP is formed between the lower and cell conductive patterns 110G and 110 and the vertical insulating layer VP. The horizontal insulating layer HP is horizontally extended to cover top and bottom surfaces of each of the lower and cell conductive patterns 110G and 110. The vertical insulating layer VP is extended between the first and second selection structures SS1 and SS2 and the first and second channel structures VS1 and VS2. The horizontal insulating layer HP is formed between the vertical insulating layer VP and the selection conductive patterns 110S and/or on top and bottom surfaces of at least one of the selection conductive patterns 110S.

An insulating gap-fill layer 150 fills gap regions between the stacked structures 100 and between the first and second selection structures SS1 and SS2. The insulating gap-fill layer covers the common source impurity region 11. The insulating gap-fill layer 150 may be formed of an insulating material. The bit lines BL cross over the stacked structures 100. The bit lines BL are coupled to the conductive pads PAD via bit line contact plugs BPLG.

According to an exemplary embodiment of the inventive concept, each of the cell strings CSTR of FIG. 2 includes one of the channel structures VS1 and VS2, the stacked structure 100, and one of the selection structures SS1 and SS2. The channel structures VS1 and VS2 may constitute metal-oxide-semiconductor field effect transistors (MOSFET) using the channel structures VS1 and VS2 as channel regions thereof, along with the lower, cell, and selection conductive patterns 110G, 110, and 110S. Alternatively, the channel structures VS1 and VS2 may constitute metal-oxide-semiconductor (MOS) capacitors, along with the lower, cell, and selection conductive patterns 110G, 110, and 110S.

The cell conductive patterns 110 positioned at substantially the same level from the substrate 10 may be used as gate electrodes of the memory cells MC shown in FIGS. 2 through 4 and may be connected to each other to be in the equipotential state. The lower conductive patterns 110G positioned at substantially the same level from the substrate 10 may be used as gate electrodes of the ground selection transistors GST shown in FIGS. 2 through 4. The selection conductive patterns 110S positioned at substantially the same level from the substrate 10 may be used as gate electrodes of the string selection transistors SST shown in FIGS. 2 through 4. Further, the selection conductive patterns 110S of the first selection structure SS1 may be connected in common to the first string selection line SSL1 of FIG. 3, and the selection conductive patterns 110S of the second selection structure SS2 may be connected in common to the second string selection line SSL2 of FIG. 3.

According to an exemplary embodiment of the inventive concept, if voltages are applied to the lower, cell, and selection conductive patterns 110G, 110, and 110S, inversion regions may be formed in the channel structures VS1 and VS2, owing to fringe electric fields induced near the lower, cell, and selection conductive patterns 110G, 110, and 110S. The inversion region may be formed to have a distance or width that is longer than a thickness of a corresponding one of the lower, cell, and selection conductive patterns 110G, 110, and 110S. In this case, the inversion regions may be vertically overlapped with each other in the channel structures VS1 and VS2 to form a current path electrically connecting the common source line CSL to a selected one of the bit lines BL.

Figure 7:
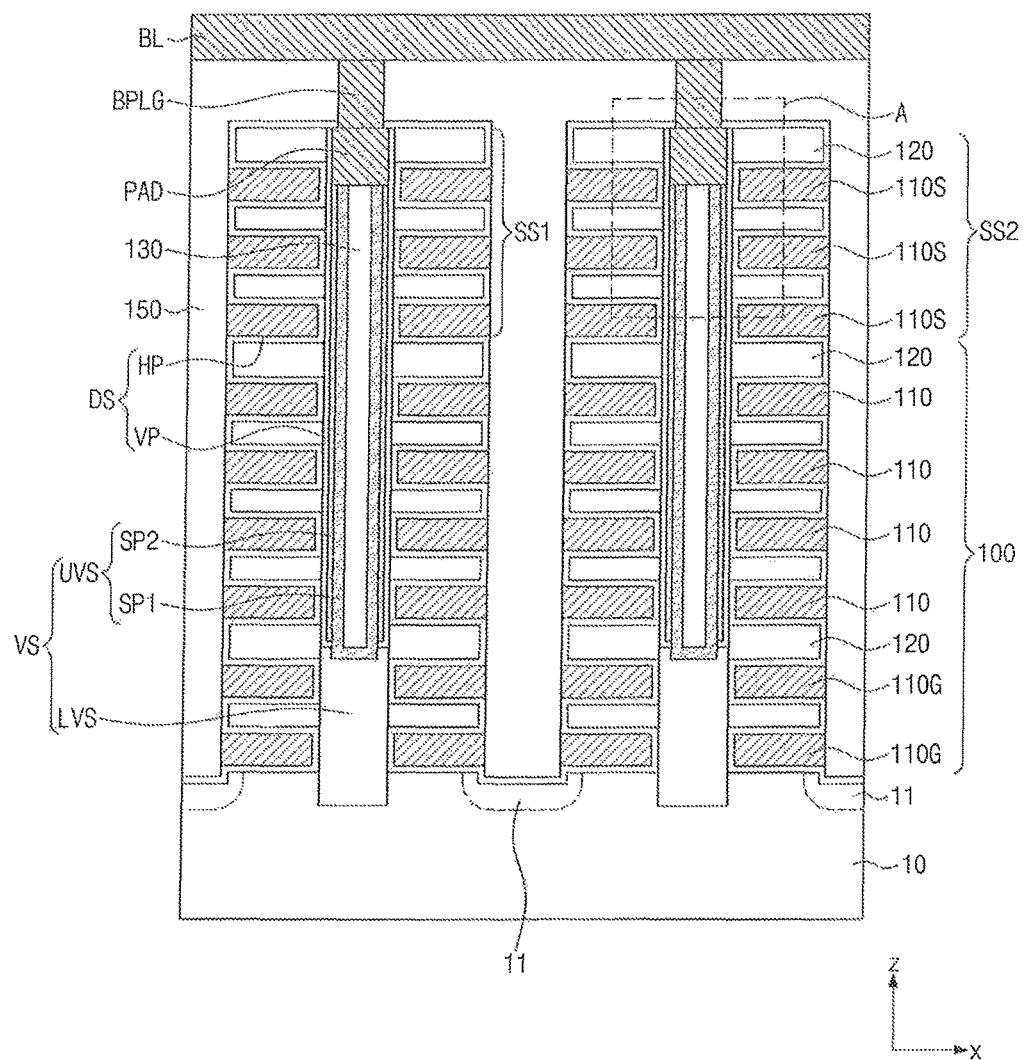

FIG. 7 is a sectional view illustrating a three-dimensional semiconductor memory device, according to an exemplary embodiment of the inventive concept.

Referring to FIG. 7, two stacked structures 100 are arranged parallel to an x-axis direction on the substrate 10, for example. Channel structures VS are formed on the substrate 10 to penetrate each of the stacked structures 100.

Each of the channel structures VS includes a lower channel structure LVS and an upper channel structure UVS. The lower channel structure LVS penetrates a lower portion of the stacked structure 100 and is connected to the substrate 10. The upper channel structure UVS penetrates an upper portion of the stacked structure 100 and is connected to the lower channel structure LVS.

In an exemplary embodiment, the bottom surface of the upper channel structure UVS is positioned below a top surface of the lower channel structure LVS. For example, the upper channel structure UVS includes a portion inserted into the lower channel structure LVS. The upper channel structure UVS may be formed of a semiconductor material. For example, the upper channel structure UVS may include a semiconductor layer, which contains at least one of silicon (Si) or germanium (Ge). The upper channel structure UVS may be a doped or intrinsic semiconductor pattern and may be formed to have one of single crystalline, amorphous, and polycrystalline structures. A conductive pad PAD is formed on the upper channel structure UVS. The conductive pad may be a doped impurity region or may be formed of a conductive material.

For example, the upper channel structure UVS includes a first semiconductor pattern SP1 and a second semiconductor pattern SP2. The first semiconductor pattern SP1 is connected to the lower channel structure LVS. The first semiconductor pattern SP1 is shaped like a hollow pipe with a closed bottom. Alternatively, the first semiconductor pattern SP1 may be shaped is a pipe or macaroni. The inner space of the first semiconductor pattern SP1 is filled with an insulating gap-fill pattern 130. The first semiconductor pattern SP1 is in contact with an inner surface of the second semiconductor pattern SP2 and with a top surface of the lower channel structure LVS. For example, the first semiconductor pattern SP1 electrically connects the second semiconductor pattern SP2 to the lower channel structure LVS. The second semiconductor pattern SP2 covers an inner sidewall of the stacked structure 100. The second semiconductor pattern SP2 is shaped like a top and bottom opened pipe or macaroni. The second semiconductor pattern SP2 need not be in contact with the lower channel structure LVS. For example, the second semiconductor pattern SP2 is separated from the lower channel structure LVS. The first and second semiconductor patterns SP1 and SP2 may be in the undoped state or may be doped to have the same conductivity type as the substrate 10. The first and second semiconductor patterns SP1 and SP2 may be provided to have a polycrystalline or single crystalline structure.

In an exemplary embodiment, the lower channel structure LVS serves as the channel region of the ground selection transistor GST described with reference to FIG. 3. The lower channel structure LVS may be formed of a semiconductor material having the same conductivity type as the substrate 10. In an exemplary embodiment, the lower channel structure LVS may be an epitaxial pattern which may be formed by an epitaxial process or a laser crystallization process using the substrate 10 as a seed semiconductor layer. In this case, the lower channel structure LVS may be formed to have a single crystalline structure or have a poly crystalline structure whose grain size is larger than that of a semiconductor layer formed by a chemical vapor deposition. For example, the lower channel structure LVS may be formed to have a poly crystalline structure (e.g., a polysilicon layer). The insulating layer 120 adjacent to the lower channel structure LVS is in direct contact with a side surface of the lower channel structure LVS.

The lower channel structure LVS is a pillar-shaped structure penetrating the lower conductive patterns 110G, for example. For example, the lower channel structure LVS is in direct contact with the substrate 10, and the bottom surface of the lower channel structure LVS is lower than a bottom surface of the lowermost lower conductive patterns 110G. The lower channel structure LVS has a top surface higher than a top surface of the uppermost lower conductive patterns 110G.

A data storing layer DS includes a vertical insulating layer VP and a horizontal insulating layer HP. The vertical insulating layer VP is provided between the upper channel structure UVS and the stacked structure 100 and between the upper channel structure UVS and the selection structures SS1 and SS2. The horizontal insulating layer HP is provided between the lower and cell conductive patterns 110G and 110 and the vertical insulating layer VP and on top and bottom surfaces of the lower and cell conductive patterns 110G and 110. Further, the horizontal insulating layer HP is provided between the vertical insulating layer VP and the selection conductive patterns 110S and on top and bottom surfaces of the selection conductive patterns 110S.

Figure 8:
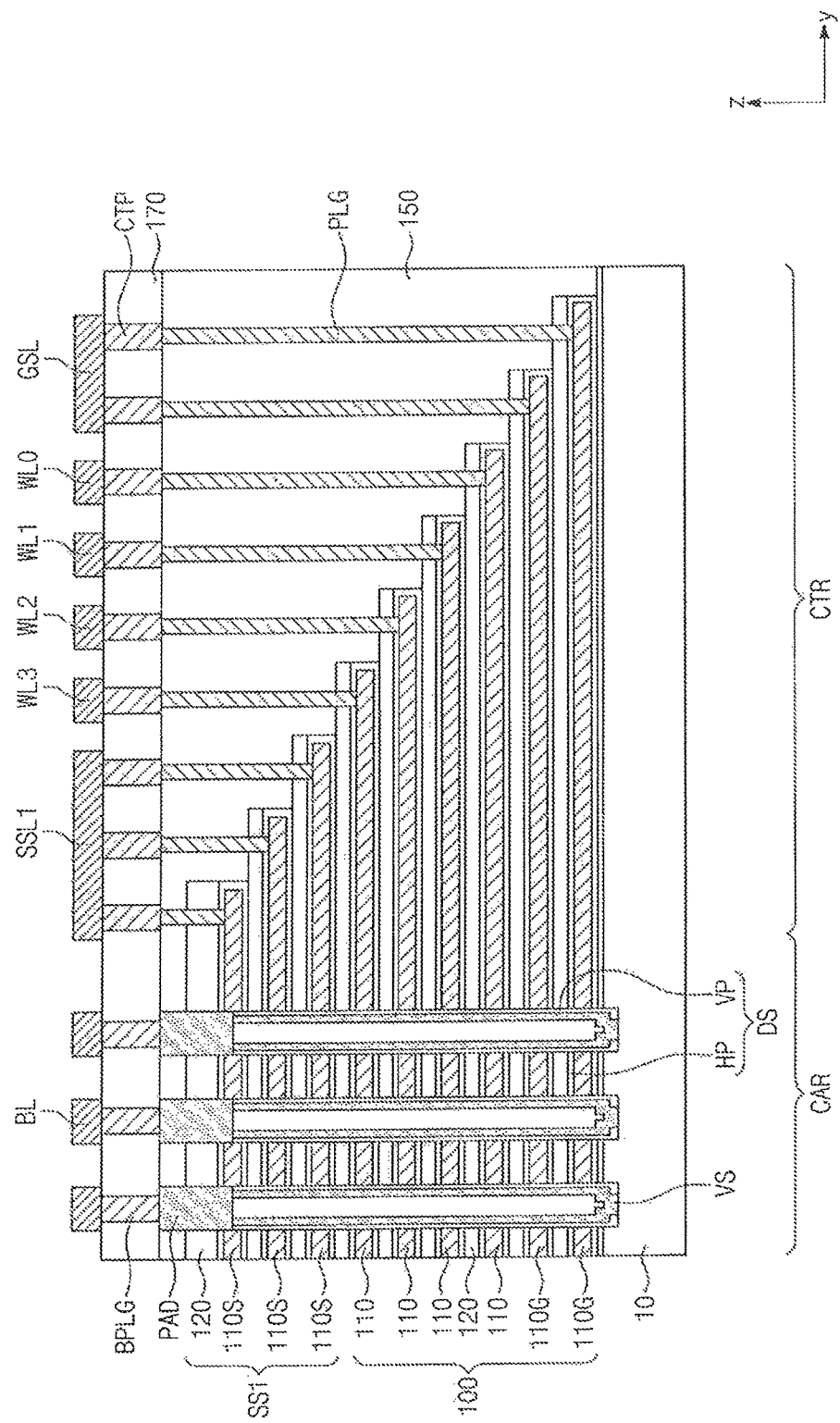
FIGS. 8 and 9 are sectional views taken along a direction of a word line of a three-dimensional semiconductor memory device, according to an exemplary embodiment of the inventive concept.
Figure 9:
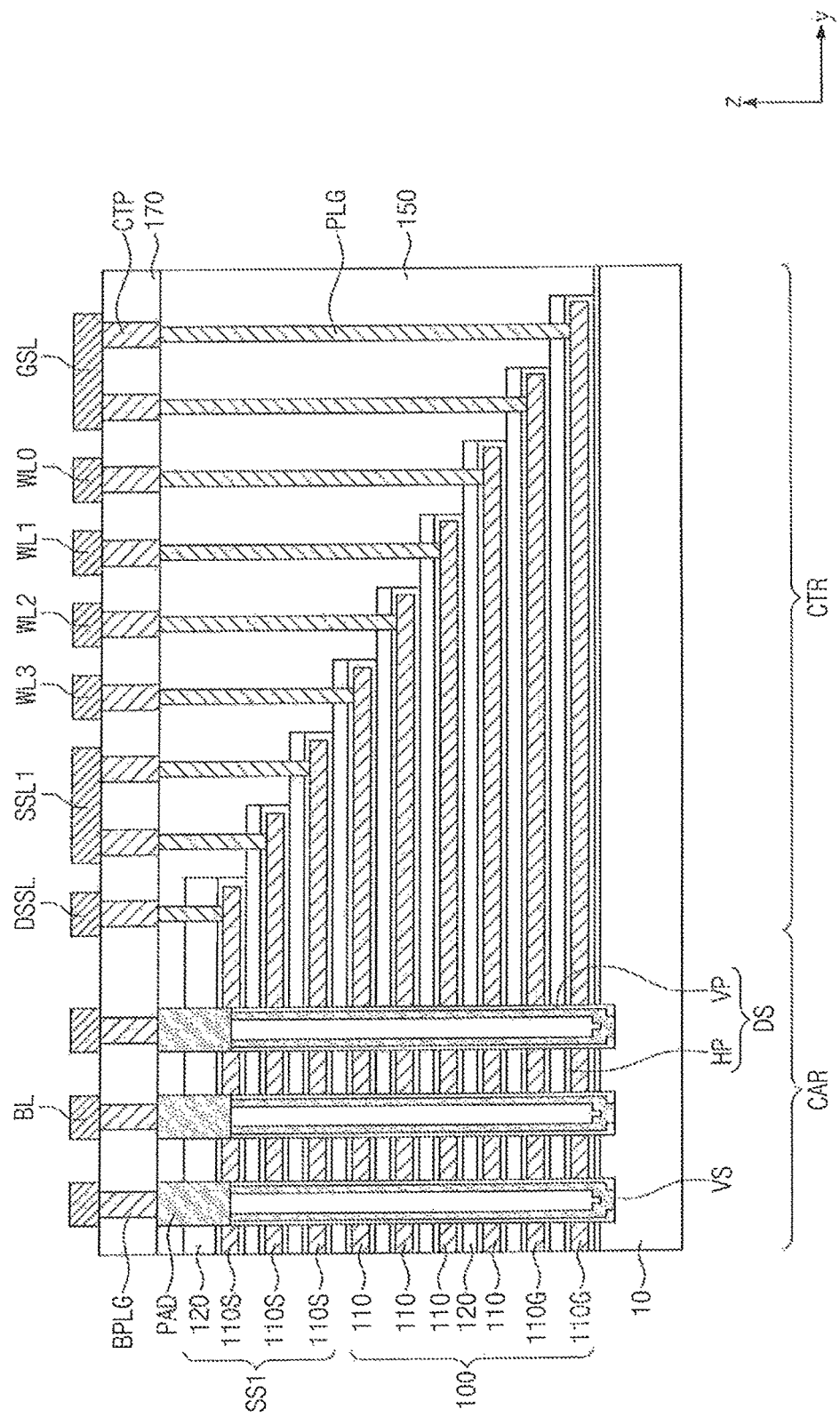
Figure 10:
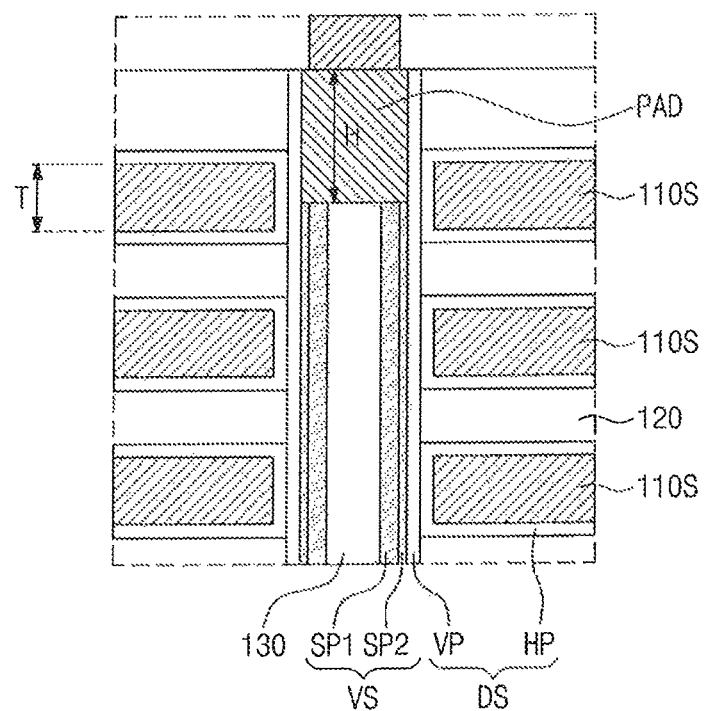
FIGS. 10 through 13 are sectional views illustrating exemplary structures of a portion A of FIG. 6.

FIGS. 8 and 9 are sectional views taken along a direction of a word line to illustrate a three-dimensional semiconductor memory device, according to an exemplary embodiment of the inventive concept.

Referring to FIGS. 8 and 9, the substrate 10 includes a cell array region CAR and a contact region CTR adjacent to the cell array region CAR.

As described with reference to FIGS. 5 and 6, the stacked structures 100 is formed on the substrate 10, and the selection structure SS1 is formed on the stacked structures 100. The stacked structures 100 and the selection structure SS1 extend from the cell array region CAR to the contact region CTR. On the cell array region CAR, a plurality of channel structures VS penetrates the stacked structures 100 and the selection structures SS1.

The stacked structures 100 have a stepwise structure on the contact region CTR to electrically connect the lower and cell conductive patterns 110G and 110 to peripheral circuits. For example, on the contact region CTR, a vertical height of the stacked structure 100 increases with decreasing distance from the cell array region CAR. For example, the stacked structures 100 have a sloped profile on the contact region CTR.

The selection structure SS1 has the stepwise structure on the contact region CTR. For example, not only the stacked structures 100 but also the selection structure SS1 has the sloped profile on the contact region CTR.

An insulating gap-fill layer 150 is formed on the substrate 10 to cover end portions of the stacked structures 100 and the selection structures SS1. The insulating gap-fill layer 150 has a flat top surface. A capping insulating layer 170 is formed on the insulating gap-fill layer 150.

The bit lines BL are formed on the capping insulating layer 170 to cross the selection structures SS1. The bit lines BL are electrically connected to the channel structures VS via the bit line contact plug BPLG.

In an exemplary embodiment, an interconnection structure may be provided on the contact region CTR to electrically connect the memory cell array to the peripheral circuit.

For example, the interconnection structure may include contact plugs PLG. The contact plugs PLG are formed on the contact region CTR to penetrate the insulating gap-fill layer 150 and are connected to the cell and selection conductive patterns 110 and 110S, respectively. The string selection line SSL1, the word lines WL0-WL3, and the ground selection line GSL are connected to the contact plugs PLG through contact patterns CTP. Vertical lengths of the contact plugs PLG decreases with decreasing distance from the cell array region CAR. The contact plugs PLG have top surfaces that are coplanar with those of the channel structures VS.

The string selection line SSL1 is connected in common to the selection conductive patterns 110S which are provided at different levels, through the contact patterns CTP and the contact plugs PLG.

Referring to FIG. 9, the dummy string selection line DSSL, the string selection line SSL1, the word lines WL0-WL3, and the ground selection line GSL are formed on the capping insulating layer 170. The dummy string selection line DSSL is electrically connected to the uppermost selection conductive patterns 110S through the contact patterns CTP and the contact plugs PLG. The dummy string selection line DSSL is connected in common to the uppermost selection conductive patterns 110S of the first and second selection structures SS1 and SS2 of FIG. 5 which are adjacent to each other in a horizontal direction. Each of the string selection lines SSL1 connects at least two the selection conductive patterns 110S to each other. The selection conductive patterns 110S are other than the uppermost selection conductive pattern 110S and are provided at different levels.

FIGS. 10 through 13 are exemplary sectional views of a portion A of FIG. 6.

According to exemplary embodiments of FIGS. 10 through 13, the channel structure VS penetrates the selection conductive patterns 110S that are vertically stacked on the substrate 10. The conductive pad PAD is formed on the channel structure VS or in a top portion thereof to connect the bit line BL to the channel structure VS.

Figure 11:
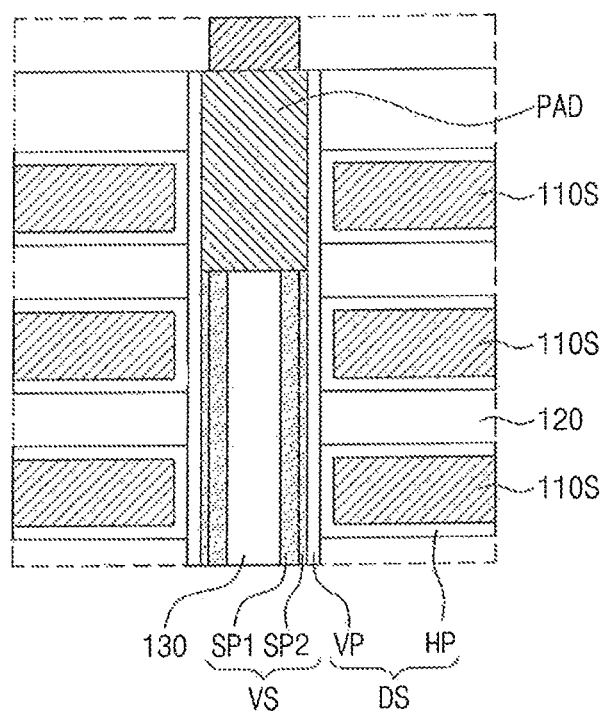

In an exemplary embodiment, the conductive pad PAD has a top surface that is higher than the top surface of the uppermost selection conductive pattern 110S, and a thickness H of the conductive pad PAD may have greater than a thickness T of the uppermost selection conductive pattern 110S. Further, the conductive pad PAD has a bottom surface that is positioned below the top surface of the uppermost selection conductive pattern 110S. For example, the bottom surface of the conductive pad PAD is positioned between the top surfaces of the selection conductive patterns 110S stacked adjacent to each other in a vertical direction. The bottom surface of the conductive pad PAD is positioned between the top and bottom surfaces of the uppermost selection conductive pattern 110S. Alternatively, as shown in FIG. 11, the bottom surface of the conductive pad PAD is positioned below the bottom surface of the uppermost selection conductive patterns 110S.

Figure 12:
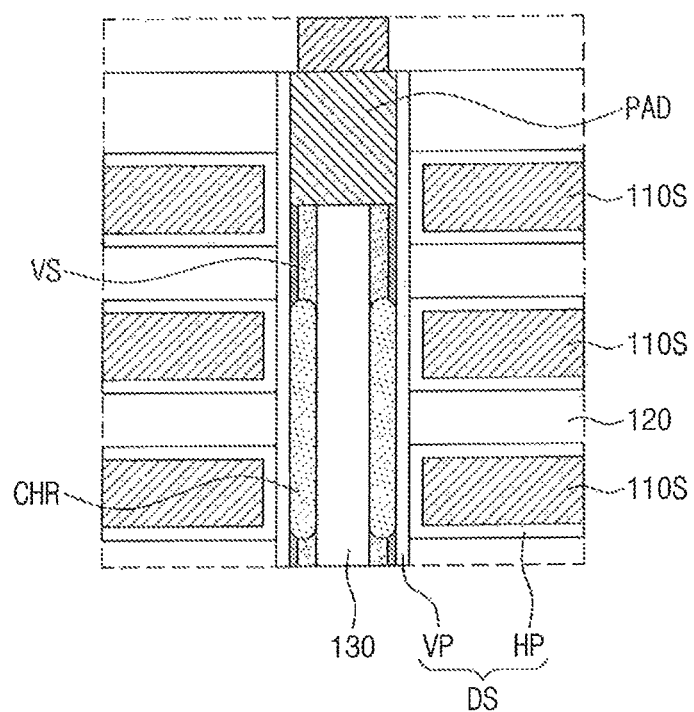
Figure 13:
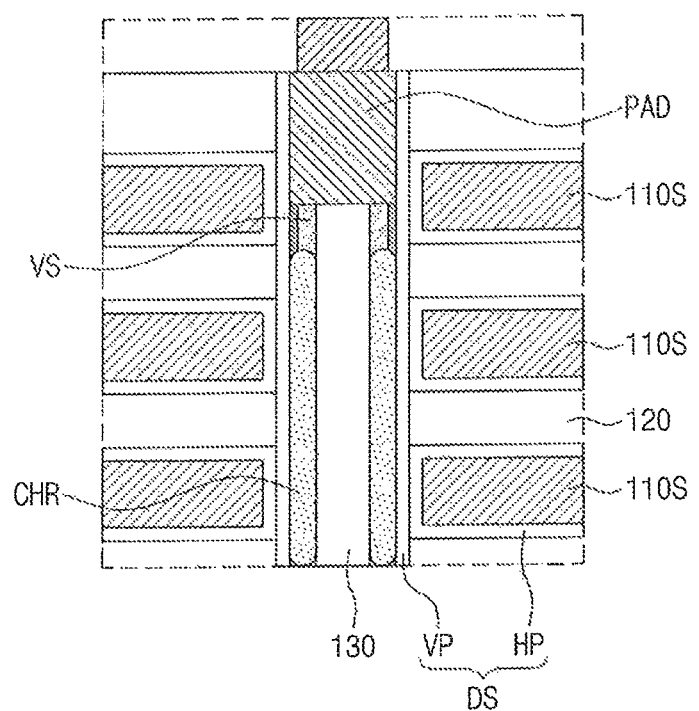

Referring to FIG. 12 and FIG. 13, the channel structure VS includes a channel impurity region CHR which is formed adjacent to the selection conductive patterns 110S. The channel structure VS may be or include an undoped or intrinsic silicon layer, and the conductive pad PAD may include a doped poly-silicon layer having a first conductivity type. The channel impurity region CHR may have a second conductivity type different from the first conductivity type. The formation of the channel impurity region CHR of the second conductivity type may include injecting impurities into the channel structure VS adjacent to the selection conductive patterns 110S. In an exemplary embodiment, the channel impurity region CHR may be formed to contain p-type impurities. A threshold voltage of the string selection transistor may be controlled by adjusting an impurity concentration of the channel impurity region CHR.

The channel impurity region CHR is spaced apart from the bottom surface of the conductive pad PAD. For example, as shown in FIG. 12 and FIG. 13, the top surface of the channel impurity region CHR is positioned below the bottom surface of the uppermost selection conductive pattern 110S. In exemplary embodiments, as shown in FIG. 13, the top surface of the channel impurity region CHR is positioned between the bottom surface of the uppermost selection conductive pattern 110S and the top surface of the selection conductive pattern 110S which is adjacent to the uppermost selection conductive pattern 110S.

Figure 14:
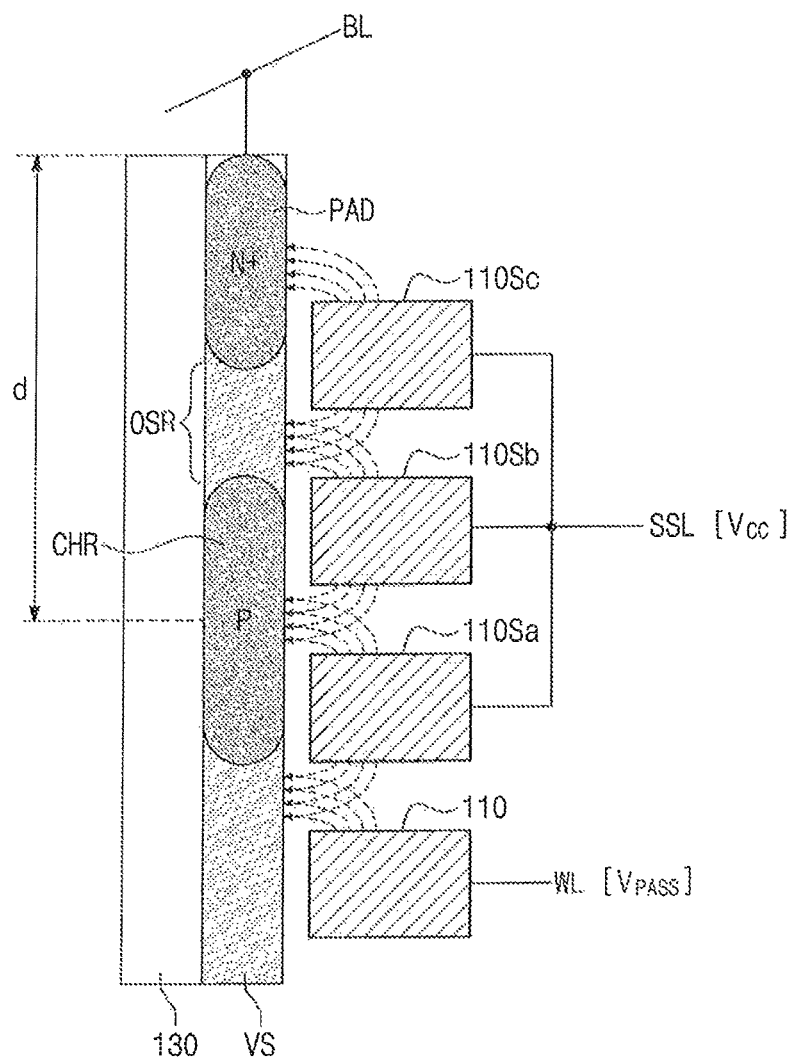
FIGS. 14 and 15 are schematic diagrams provided to describe operations of a three-dimensional semiconductor memory device according to an exemplary embodiment of the inventive concept.
Figure 15:
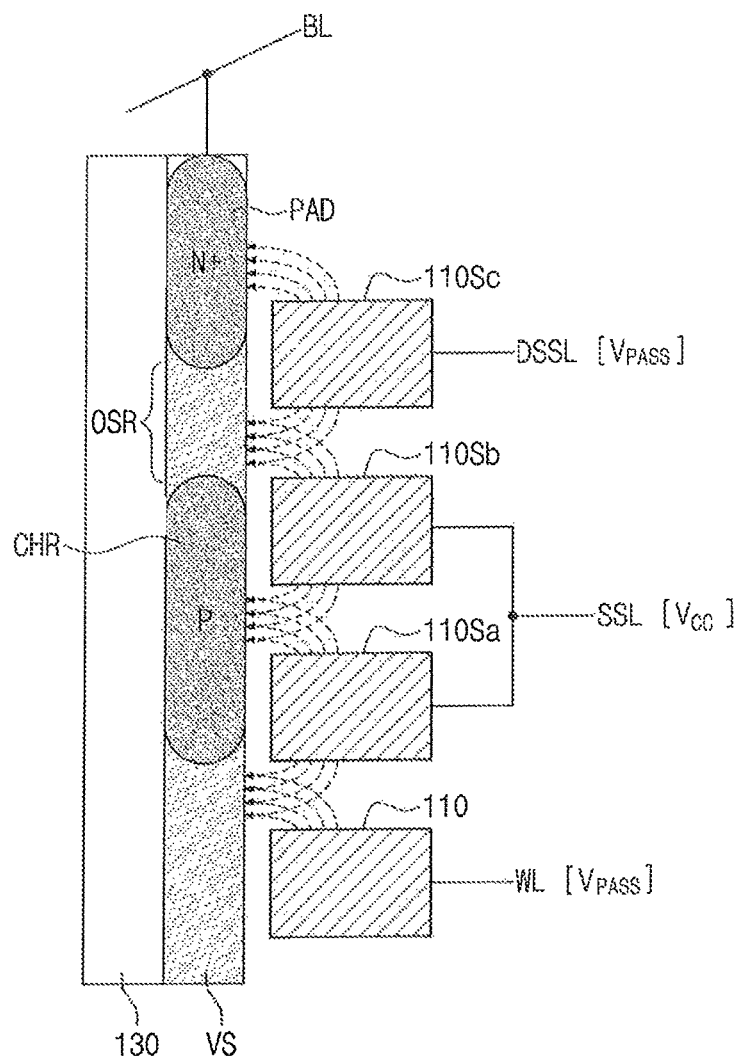
Figure 16:
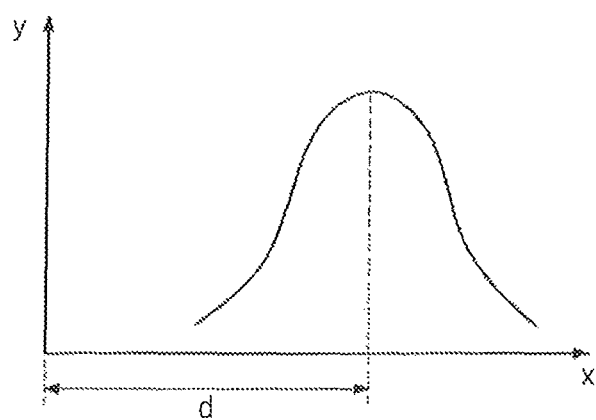
FIG. 16 is a graph showing a doping profile of a channel impurity region of a three-dimensional semiconductor memory device according to an exemplary embodiment of the inventive concept.

FIGS. 14 and 15 are schematic diagrams provided to describe operations of a three-dimensional semiconductor memory device according to an exemplary embodiment of the inventive concept. FIG. 16 is a graph showing a doping profile of a channel impurity region of a three-dimensional semiconductor memory device according to an exemplary embodiment of the inventive concept.

Referring to FIG. 14, the selection structure provided on the cell conductive pattern 110 includes a first selection conductive pattern 110Sc provided at the uppermost level thereof and at least two second selection conductive patterns 110Sa and 110Sb provided between the first selection conductive pattern 110Sc and the cell conductive pattern 110.

The channel structure VS includes the channel impurity region CHR provided adjacent to the second selection conductive patterns 110Sa and 110Sb. Here, the conductive pad PAD has a first conductivity type, whereas the channel impurity region CHR has a second conductivity type. For example, the conductive pad PAD includes n-type impurities, and the channel impurity region CHR includes p-type impurities. Referring to FIG. 16, in the channel impurity region CHR, an impurity concentration is maximum at a position between the second selection conductive patterns 110Sa and 110Sb. Further, the channel impurity region CHR is spaced apart from the bottom surface of the conductive pad PAD. The channel structure VS includes an offset region OSR between the conductive pad PAD and the channel impurity region CHR.

In an exemplary embodiment, the conductive pad PAD may be a doped n-type poly-silicon layer. In this case, since the conductive pad PAD is provided adjacent to a portion of the first selection conductive pattern 110Sc, a threshold voltage of a MOS FET whose gate electrode is the first selection conductive pattern 110Sc, may be lower than those of MOS FETs whose gate electrodes are the second selection conductive patterns 110Sa and 110Sb.

Referring to FIG. 14, the first selection conductive pattern 110Sc and the second selection conductive patterns 110Sa and 110Sb are connected in common to the string selection line SSL. An operation of the three-dimensional memory device may include applying a pass voltage $V_{PASS}$ to the word lines WL and applying a supply voltage Vcc which is greater than the pass voltage $V_{PASS}$ to the string selection lines SSL. Here, the pass voltage $V_{PASS}$ may be selected to be greater than a threshold voltage required for forming an inversion layer in the channel structure VS. According to this condition, due to the supply voltage Vcc applied to the string selection line SSL, an inversion layer may be formed in a portion of the channel structure VS adjacent to the second selection conductive patterns 110Sa and 110Sb. Further, due to voltages applied to the first selection conductive pattern 110Sc and the second selection conductive pattern 110Sb or a fringe electric field, the inversion layer may be expanded toward the offset region OSR of the channel structure VS. In the offset region OSR of the channel structure VS, the inversion layer may serve as a source or drain region of the string selection transistor. For example, according to an exemplary embodiment of the inventive concept, the fringe electric field may be induced in the offset region OSR by the voltages applied to the first selection conductive pattern 110Sc and the second selection conductive pattern 110Sb, so that the electric resistance of the string selection transistor is reduced. In addition, according to an exemplary embodiment of the inventive concept, a distance between the conductive pad PAD and the first selection conductive pattern 110Sc is decreased to reduce a variation in threshold voltage of the string selection transistors.

According to the embodiment shown in FIG. 15, the first selection conductive pattern 110Sc is connected to the dummy string selection line DSSL, and the second selection conductive patterns 110Sa and 110Sb are connected in common to the string selection line SSL. An operation of the three-dimensional memory device may include applying a pass voltage VPASS to the word lines WL and the dummy string selection line DSSL and applying a supply voltage Vcc which is greater than the pass voltage VPASS to the string selection lines SSL. Due to the supply voltage Vcc applied to the string selection line SSL, an inversion layer may be formed in a portion of the channel structure VS adjacent to the second selection conductive patterns 110Sb and 110Sc. Further, due to voltages applied to the first selection conductive pattern 110Sc and the second selection conductive pattern 110Sb or consequent fringe field, the inversion layer may be expanded toward the offset region OSR of the channel structure VS. For example, by applying the pass voltage VPASS to the first selection conductive pattern 110Sc, an electric field may be prevented from being weakly induced in the channel structure VS between the conductive pad PAD and the second selection conductive pattern 110Sb.

FIGS. 17 through 24 are perspective views illustrating exemplary structures of a data storing layer according to an exemplary embodiment of the inventive concept.

According to an exemplary embodiment of the inventive concept, the three-dimensional semiconductor memory device may be a FLASH memory, and in this case, the three-dimensional semiconductor memory device may include a data storing layer provided between the semiconductor pattern SP and the conductive pattern 110. The data storing layer may include a tunnel insulating layer TIL, a charge storing layer CL, and a first blocking insulating layer BIL1. Here, the data storing layer may constitute a partial or whole portion of the vertical insulating layer or the horizontal insulating layer of the afore-described embodiments. In an exemplary embodiment, the data storing layer may further include a second blocking insulating layer BIL2 disposed between the first blocking insulating layer BIL1 and the conductive pattern 110. Furthermore, the data storing layer may further include a capping layer CPL interposed between the charge storing layer CL and the first blocking insulating layer BIL1. The layers constituting the data storing layer may be formed using a deposition technique providing a good step-coverage property (for example, chemical vapor deposition or atomic layer deposition technique).

Figure 19:
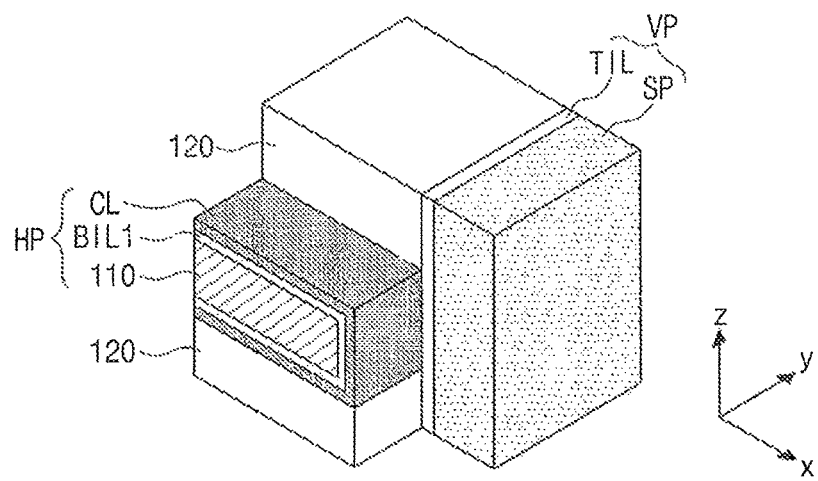
Figure 20:
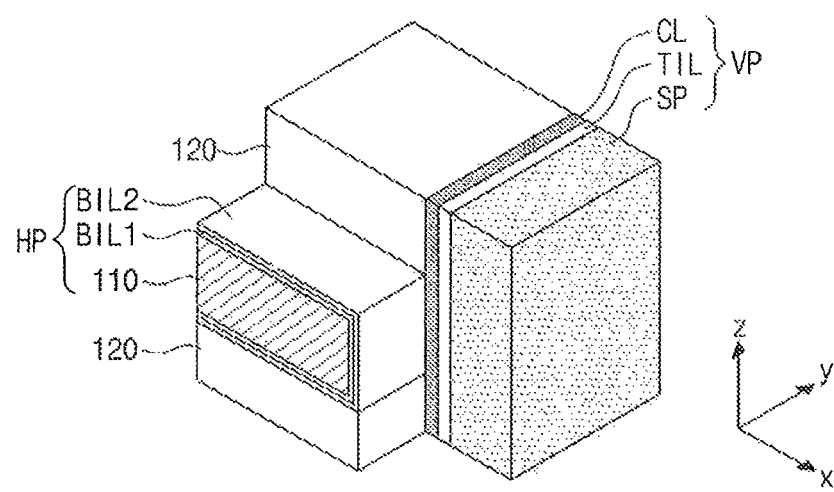
Figure 21:
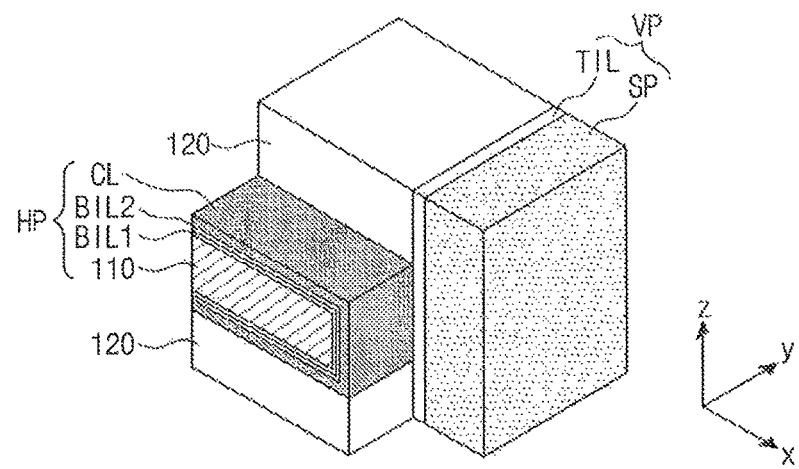

As shown in FIGS. 17 through 24, the vertical insulating layer VP includes the tunnel insulating layer TIL, and the horizontal insulating layer HP includes at least one of the first and second blocking insulating layers BIL1 and BIL2. As shown in FIGS. 17, 18, 20, 22, 23, and 24, the vertical insulating layer VP includes the charge storing layer CL. As shown in FIGS. 19 and 21, the horizontal insulating layer HP includes the charge storing layer CL.

In the case where the vertical insulating layer VP includes the charge storing layer CL, the vertical insulating layer VP further includes a capping layer CPL, as shown in FIGS. 17, 22, 23, and 24. However, as shown in FIGS. 20 and 20, the vertical insulating layer VP is in direct contact with the horizontal insulating layer HP without the capping layer CPL interposed therebetween.

Figure 17:
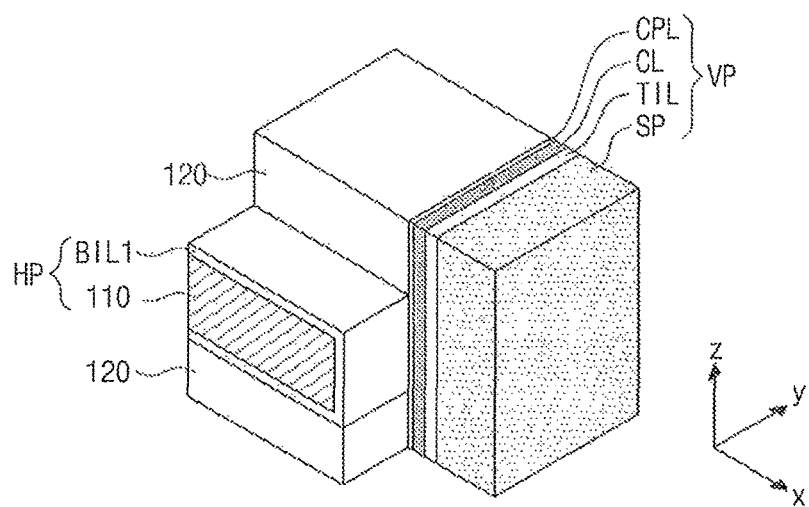
FIGS. 17 through 24 are perspective views illustrating exemplary structures of a data storing layer according to an exemplary embodiment of the inventive concept.
Figure 18:
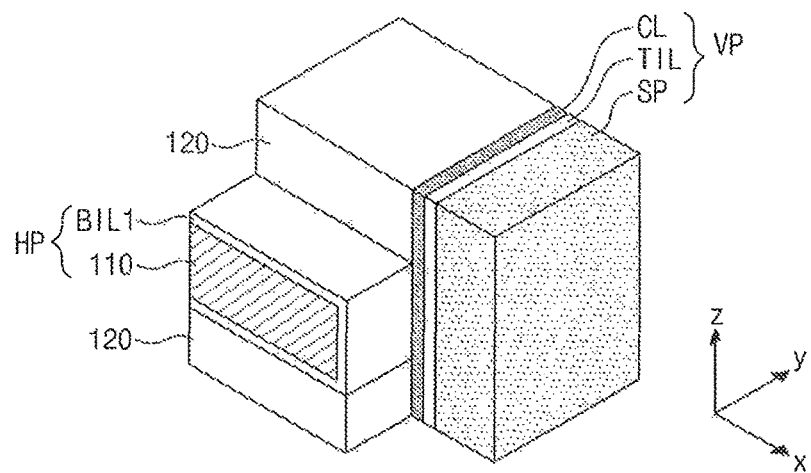
Figure 22:
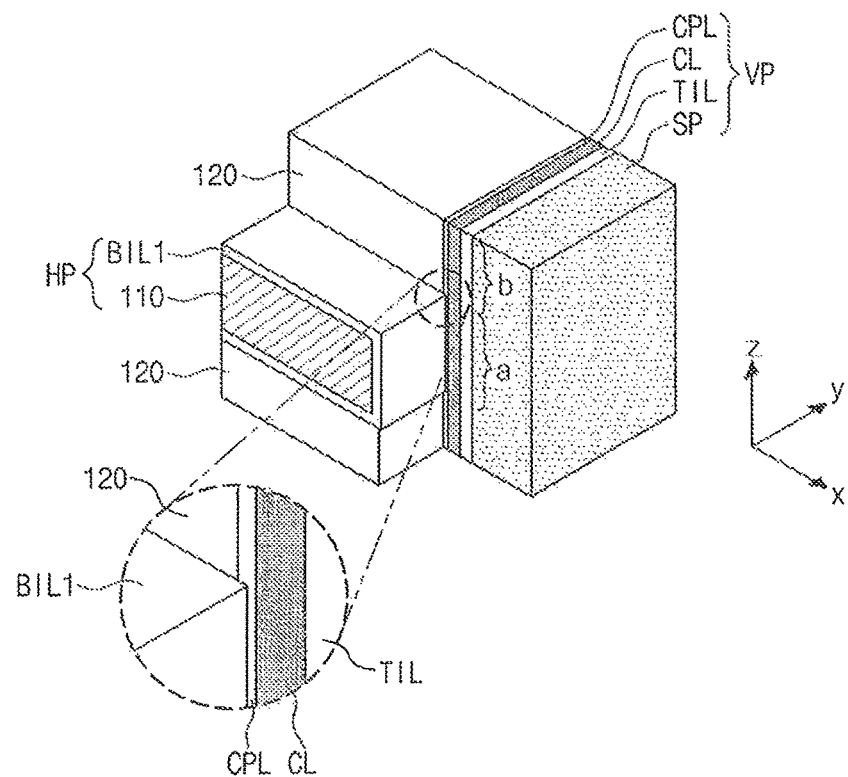
Figure 23:
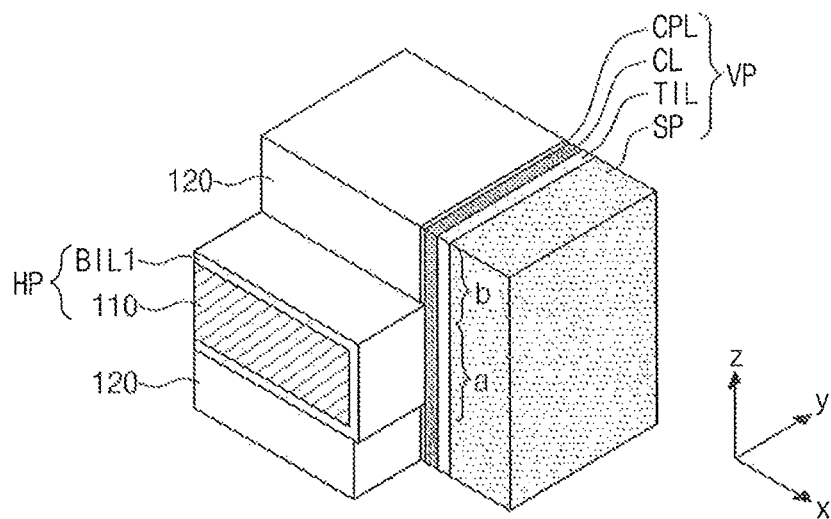

In an exemplary embodiment, the capping layer CPL may be formed to have a non-uniform thickness. For example, as shown in FIG. 22, the thickness of the capping layer CPL is greater in a region b (hereinafter, a vertically-adjacent region) between the horizontal insulating layers HP than in a region a (hereinafter, a channel region) adjacent to the horizontal insulating layer HP. Alternatively, as shown in FIG. 23, the capping layer CPL exists in only the vertically adjacent regions b, and thus, in the channel region a, the horizontal insulating layer HP is in direct contact with the charge storing layer CL. However, as shown in FIGS. 17 and 24, the capping layer CPL has a substantially uniform thickness.

Figure 24:
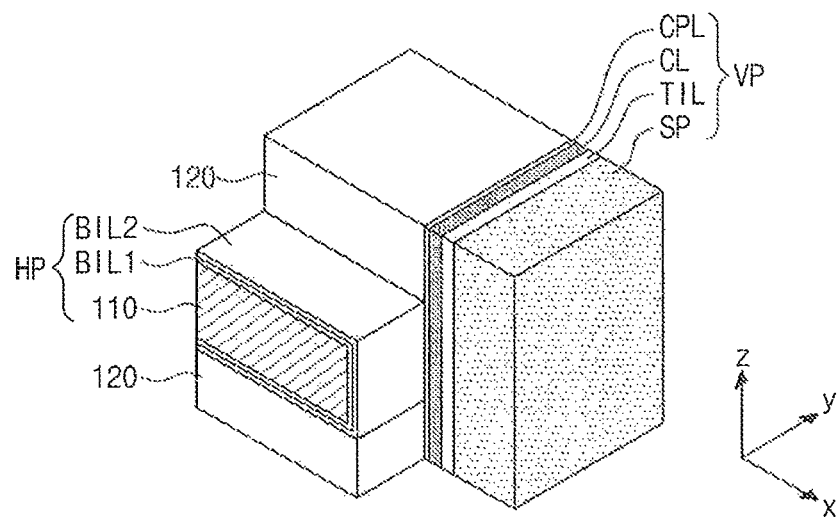

As shown in FIGS. 20, 21, and 24, the horizontal insulating layer HP includes both the first and second blocking insulating layers BIL1 and BIL2.

The charge storing layer CL may include one or more insulating layers with abundant trap sites and/or one or more insulating layers with nano particles, and may be formed using a chemical vapor deposition process or an atomic layer deposition process. For example, the charge storing layer CL may include a trap insulating layer, a floating gate electrode, and/or an insulating layer with conductive nano dots. For example, the charge storing layer CL may include at least one of a silicon nitride layer, a silicon oxynitride layer, a silicon-rich nitride layer, a nano crystalline silicon layer, and a laminated trap layer.

The tunnel insulating layer TIL may be one of materials with a higher band gap than the charge storing layer CL and may be formed using a chemical vapor deposition process or an atomic layer deposition process. For example, the tunnel insulating layer TIL may be a silicon oxide layer or a silicon oxynitride layer. A thermal treatment may be further performed on the tunnel insulating layer TIL, after its deposition process. The thermal treatment process may include, for example, a rapid thermal nitridation (RTN) process and/or an annealing process in an atmosphere including nitrogen and/or oxygen.

The first and second blocking insulating layers BIL1 and BIL2 may be formed of different materials. For example, one of the first and second blocking insulating layers BIL1 and BIL2 may be formed of one of materials whose band gap energy is smaller than that of the tunnel insulating layer TIL and greater than that of the charge storing layer CL. The first and second blocking insulating layers BIL1 and BIL2 may be formed using a chemical vapor deposition (CVD) process or an atomic layer deposition (ALD) process. At least one of the first and second blocking insulating layers BIL1 and BIL2 may be thermally treated by an annealing process which may be performed under a gas ambient containing at least one of nitrogen and oxygen. In an exemplary embodiment, the first blocking insulating layer BIL1 may be formed of one of high-k dielectrics (e.g., aluminum oxide and hafnium oxide), and the second blocking insulating layer BIL2 may be formed of a material having a smaller dielectric constant than the first blocking insulating layer BIL1. Alternatively, the second blocking insulating layer BIL2 may be formed of one of the high-k dielectrics, and the first blocking insulating layer BIL1 may be formed of a material having a smaller dielectric constant than the second blocking insulating layer BIL2. Alternatively, in addition to the first and second blocking insulating layers BIL1 and BIL2, at least one additional blocking insulating layer (not shown) may be provided between the charge storing layer CL and the conductive pattern 110.

The capping layer CPL may be formed of a material exhibiting etch selectivity with respect to the charge storing layer CL. For example, in the case where the charge storing layer CL is a silicon nitride layer, the capping layer CPL may be a silicon oxide layer. As shown in FIGS. 17, 22, 23, and 24, in the case where the capping layer CPL exists between the conductive pattern 110 and the charge storing layer CL, the capping layer CPL may be formed of a material capable of preventing electric charges stored in the charge storing layer CL from being unintentionally discharged. For example, the capping layer CPL may prevent a back-tunneling effect from occurring. For example, the capping layer CPL may be formed of or include at least one of silicon oxide and high-k dielectrics.

Figure 25:
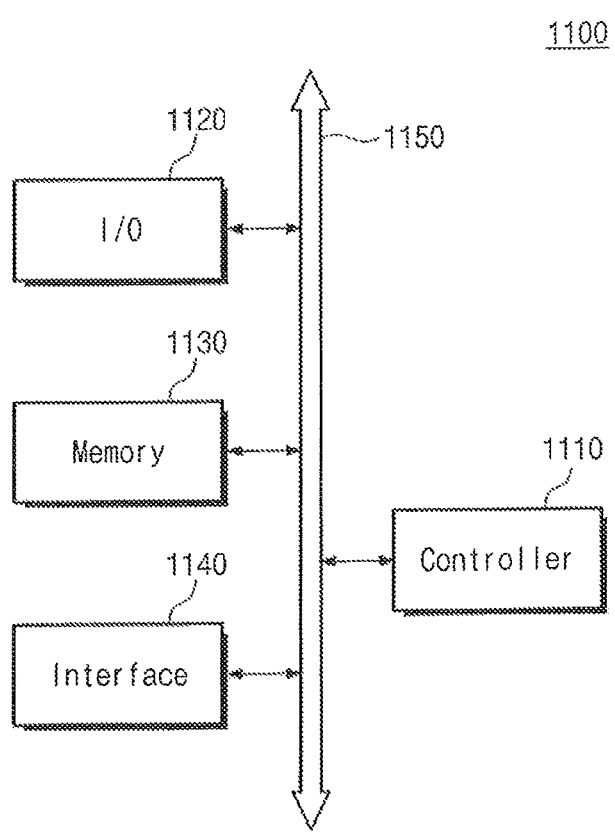
FIG. 25 is a block diagram illustrating a memory system including a three-dimensional semiconductor memory device according to an exemplary embodiment of the inventive concept.

FIG. 25 is a block diagram illustrating a memory system including a three-dimensional semiconductor memory device according to an exemplary embodiment of the inventive concept.

Referring to FIG. 25, a memory system 1100 may be applied to a personal digital assistant (PDA), a portable computer, a web tablet, a wireless phone, a mobile phone, a digital music player, a memory card and/or all the devices that can transmit and/or receive data in a wireless communication environment.

The memory system 1100 includes a controller 1110, an input/output device 1120 such as a keypad and a display device, a memory device 1130, an interface 1140 and a bus 1150. The memory device 1130 and the interface 1140 communicate with each other through the bus 1150.

The controller 1110 includes at least one microprocessor, at least one digital signal processor, at least one micro controller or other process devices similar to the microprocessor, the digital signal processor and the micro controller. The memory device 1130 may be used to store an instruction executed by the controller 1110. The input/output device 1120 can receive data or a signal from the outside of the system 1100 or transmit data or a signal to the outside of the system 1100. For example, the input/output device 1120 may include a keyboard, a keypad and/or a displayer.

The memory device 1130 includes a three-dimensional semiconductor memory devices according to an exemplary embodiment of the inventive concept. The memory device 1130 may further include other memory devices, such as randomly-accessible volatile memory devices.

The interface 1140 transmits data to a communication network or receives data from a communication network.

Furthermore, a three-dimensional semiconductor memory device according to the inventive concept or a memory system comprising the same may be packaged in various kinds of ways. For instance, the three-dimensional semiconductor memory device or the memory system may be employed in a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi-chip package (MCP) technique, a wafer-level fabricated package (WFP) technique and a wafer-level processed stack package (WSP) technique. The package in which the three-dimensional semiconductor device according to one of the above embodiments is mounted may further include at least one semiconductor device (e.g., a controller and/or a logic device) that controls the three-dimensional semiconductor device.

Figure 26:
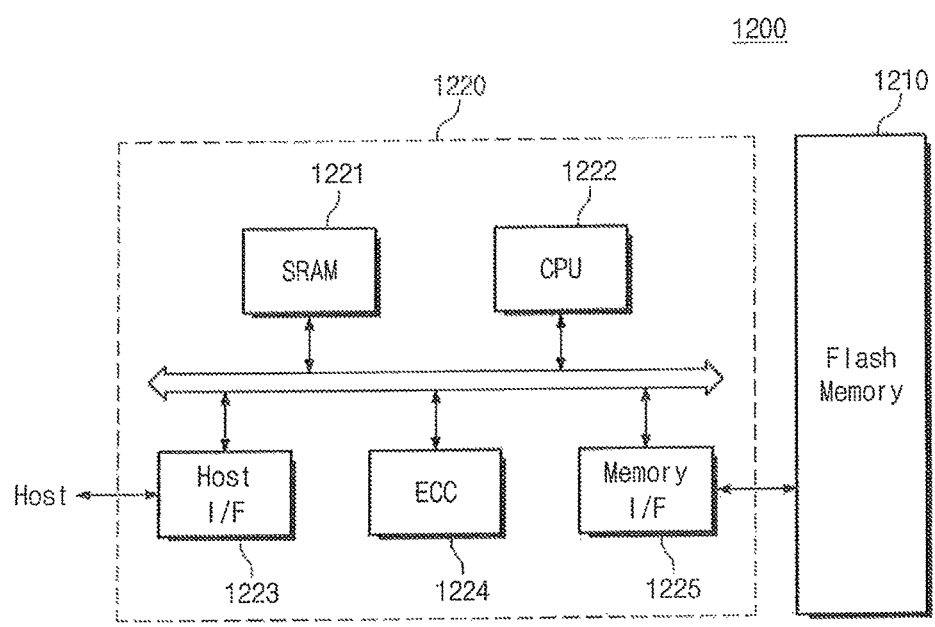
FIG. 26 is a block diagram illustrating a memory card including a three-dimensional semiconductor memory device according to an exemplary embodiment of the inventive concept.

FIG. 26 is a block diagram illustrating a memory card including a three-dimensional semiconductor memory device according to an exemplary embodiment of the inventive concept.

Referring to FIG. 26, the memory card 1200 includes a semiconductor memory device 1210. The semiconductor memory device 1210 may include a three-dimensional semiconductor memory device according to an exemplary embodiment of the inventive concept. The memory card 1200 includes a memory controller 1220 configured to control a data exchange operation between a host and the semiconductor memory device 1210.

A static random access memory (SRAM) 1221 is used as an operation memory of a processing unit 1222. A host interface 1223 includes data exchange protocols of a host to be connected to the memory card 1200. An error correction block 1224 detects and corrects errors included in data readout from a multi bit semiconductor memory device 1210. A memory interface 1225 interfaces with the semiconductor memory device 1210. The processing unit 1222 performs every control operation for exchanging data of the memory controller 1220. The memory card 1200 may further include a read only memory (ROM) (not shown) storing code data for interfacing with the host.

Figure 27:
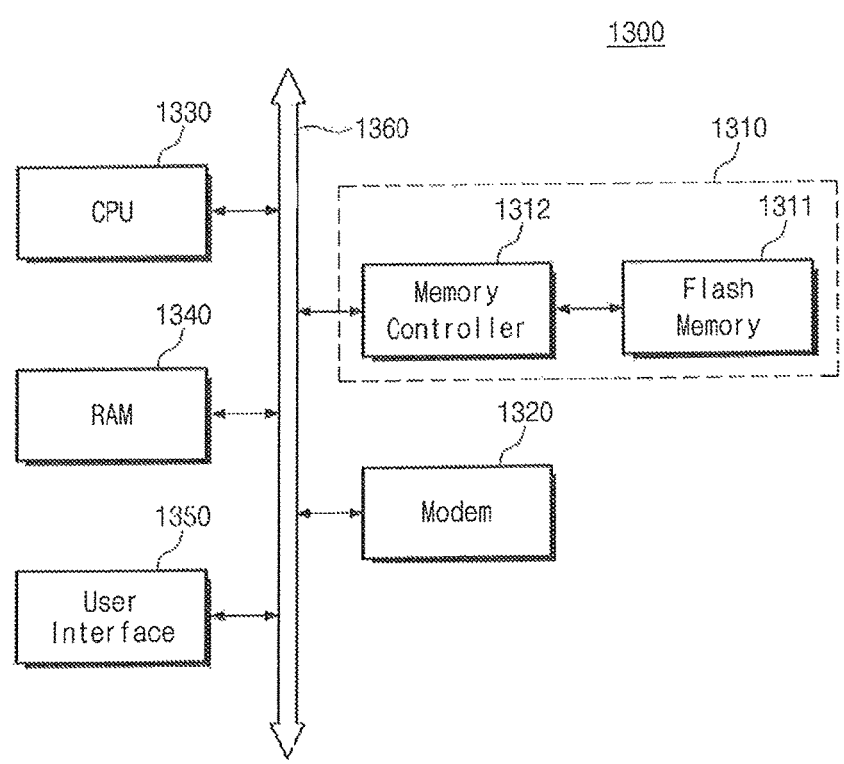
FIG. 27 is a schematic block diagram illustrating an information processing system including a three-dimensional semiconductor memory device according to an exemplary embodiment of the inventive concept.

FIG. 27 is a schematic block diagram illustrating an information processing system including a three-dimensional semiconductor memory devices according to an exemplary embodiment of the inventive concept.

Referring to FIG. 27, an information processing system 1300 includes a memory system 1310 including a three-dimensional semiconductor memory device according to an exemplary embodiment of the inventive concept. For example, the information processing system 1300 may be a mobile device and/or a desktop computer. In some embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312. In some embodiments, the memory system 1310 may be configured substantially identical to the memory card 1200 described with respect to FIG. 19. Data processed by the CPU 1330 and/or input from the outside may be stored in the memory system 1310. In some embodiments, the memory system 1310 may be used as a portion of a solid state drive SSD, and in this case, the information processing system 1300 may stably and reliably store a large amount of data in the memory system 1310. Although not illustrated, it is apparent to those skilled in the art that, for example, an application chipset, a camera image sensor, a camera image signal processor (ISP), an input/ output device, or the like may further be included in the information processing system 1300 according to the inventive concept.

In a three-dimensional semiconductor memory device according to an exemplary embodiment of the inventive concept, a contact pad connecting a bit line to a channel structure may be formed to have a bottom surface positioned below a top surface of the uppermost selection conductive pattern. Accordingly, it is possible to prevent a string selection transistor from having an increased electric resistance. Further, according to an exemplary embodiment of the inventive concept, a distance between the conductive pad PAD and the first selection conductive pattern 110Sc may be decreased to reduce a variation in threshold voltage of the string selection transistors.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A three-dimensional semiconductor memory device, comprising:
a stacked structure including a plurality of conductive patterns vertically stacked on a substrate;
a selection structure including first, second, and third selection conductive patterns sequentially stacked on the stacked structure;
a channel structure penetrating the selection structure and the stacked structure to connect to the substrate;
an upper interconnection line crossing the selection structure; and
a conductive pad disposed on the channel structure to electrically connect the upper interconnection line to the channel structure,
wherein a bottom surface of the conductive pad is positioned between top and bottom surfaces of the third selection conductive pattern,
wherein the conductive pad has impurities of a first conductivity type, and the channel structure comprises a channel impurity region having impurities of a second conductivity type different from the first conductivity type and positioned adjacent to the first and second selection conductive patterns, and
wherein the channel impurity region is spaced apart from the bottom surface of the conductive pad.

2. The device of claim 1, wherein the bottom surface of the conductive pad is positioned between top surfaces of two adjacent selection conductive patterns in a vertical direction.

3. The device of claim 1, wherein the bottom surface of the conductive pad is positioned between top and bottom surfaces of the uppermost selection conductive pattern.

4. The device of claim 1, wherein a thickness of the conductive pad is greater than that of the uppermost selection conductive pattern.

5. The device of claim 1, wherein the plurality of selection conductive patterns is electrically connected to each other to be in an equipotential state.

6. The device of claim 1, wherein
the first selection conductive pattern is electrically separated from the second selection conductive patterns.

7. The device of claim 1, further comprising:
a vertical insulating layer vertically extending from a region between the channel structure and the stacked structure to a region between the channel structure and the selection structure; and
a horizontal insulating layer provided between the vertical insulating layer and the channel structure and extended to cover top and bottom surfaces of the selection conductive patterns and the conductive patterns.

8. The device of claim 1, wherein a vertical insulating layer vertically extends from a region between the channel structure and the selection structure to cover a sidewall of the conductive pad.

9. The device of claim 1, wherein at least one of the plurality of selection conductive patterns has substantially the same thickness as that of at least one of the plurality of conductive patterns.

10. The device of claim 1, wherein the first, second, and third selection conductive patterns are electrically connected in common.

11. A three-dimensional semiconductor memory device, comprising:
a substrate;
a vertical channel formed on the substrate;
a conductive pad formed on the vertical channel, wherein the conductive pad includes impurities of a first conductivity type;
a bit line formed on the conductive pad, wherein the bit line is electrically coupled to the conductive pad;
a plurality of word lines vertically formed on the substrate which is adjacent to the vertical channel; and
first, second, and third selection conductive patterns sequentially stacked on the plurality of word lines,
wherein the vertical channel includes a channel impurity region and an offset region, wherein the offset region is interposed between the conductive pad and the channel impurity region, and wherein the channel impurity region has impurities of a second conductivity type different from the first conductivity type,
wherein the channel impurity region is adjacent the first and second selection conductive patterns, and
wherein an impurity concentration of the channel impurity region is maximum at a position between the first and the second selection conductive patterns.

12. The three-dimensional semiconductor memory device of claim 11, wherein the bottom surface of the conductive pad is positioned between top and bottom surfaces of the third selection conductive pattern.

13. The three-dimensional semiconductor memory device of claim 11, wherein the third selection conductive pattern horizontally overlap the conductive pad, and the remaining selection conductive patterns horizontally overlap the channel impurity region.

14. The three-dimensional semiconductor memory device of claim 11, wherein the first conductivity type is of n-type, and the second conductivity type is of p-type.

15. The three-dimensional semiconductor memory device of claim 11, wherein the offset region, the conductive pad and the third selection conductive pattern constitutes a selection transistor, wherein the offset region serves as a source/drain of the selection transistor.

* * * * *